(12) United States Patent
Io

(10) Patent No.: US 8,405,140 B2
(45) Date of Patent: Mar. 26, 2013

(54) NONVOLATILE SEMICONDUCTOR MEMORY DEVICE AND MANUFACTURING METHOD THEREFOR

(75) Inventor: Eiji Io, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 221 days.

(21) Appl. No.: 12/285,750

(22) Filed: Oct. 14, 2008

(65) Prior Publication Data

US 2009/0096015 A1 Apr. 16, 2009

(30) Foreign Application Priority Data

Oct. 15, 2007 (JP) ................................. 2007-268005

(51) Int. Cl.
*H01L 29/792* (2006.01)
(52) U.S. Cl. .. 257/324; 257/317; 257/322; 257/E21.209
(58) Field of Classification Search .................. 257/317, 257/318, 322, E21.209
See application file for complete search history.

(56) References Cited

U.S. PATENT DOCUMENTS

| | | | |
|---|---|---|---|
| 6,525,371 B2 | 2/2003 | Johnson et al. | |
| 6,653,188 B1 * | 11/2003 | Huang et al. | 438/257 |
| 6,873,006 B2 | 3/2005 | Chen et al. | |
| 6,965,144 B2 * | 11/2005 | Hsieh | 257/319 |
| 7,180,127 B2 * | 2/2007 | Chen et al. | 257/317 |
| 7,208,376 B2 | 4/2007 | Chen et al. | |
| 7,323,743 B2 * | 1/2008 | Chuang et al. | 257/316 |
| 7,557,402 B2 * | 7/2009 | Shyu et al. | 257/314 |
| 2003/0219943 A1 * | 11/2003 | Lin et al. | 438/257 |
| 2004/0183118 A1 | 9/2004 | Chen et al. | |
| 2004/0197996 A1 | 10/2004 | Chen et al. | |
| 2005/0199914 A1 | 9/2005 | Chen et al. | |

FOREIGN PATENT DOCUMENTS

| | | |
|---|---|---|
| JP | 2001-284473 A | 10/2001 |
| JP | 2004-289161 | 10/2004 |
| JP | 2004-289162 A | 10/2004 |

OTHER PUBLICATIONS

Japanese Office Action dated Dec. 10, 2012 with partial English translation thereof.

* cited by examiner

*Primary Examiner* — John C Ingham
(74) *Attorney, Agent, or Firm* — McGinn IP Law Group, PLLC

(57) ABSTRACT

In a nonvolatile semiconductor memory device, a floating gate is formed on a semiconductor substrate through a gate insulating film, and has a first portion contacting the gate insulating film and a second portion extending upwardly from a part of a surface of the first portion. A first diffusion layer is formed in the semiconductor substrate to have a plane parallel to a surface of the semiconductor substrate. A second diffusion layer is formed in the semiconductor substrate, to have the plane. A control gate is provided near the floating gate above a channel region in the semiconductor substrate and is formed on a first side of the first portion. A conductive film is connected with the first diffusion layer and is formed on a second side of the first portion and a first side of the second portion through the first insulating film.

20 Claims, 34 Drawing Sheets

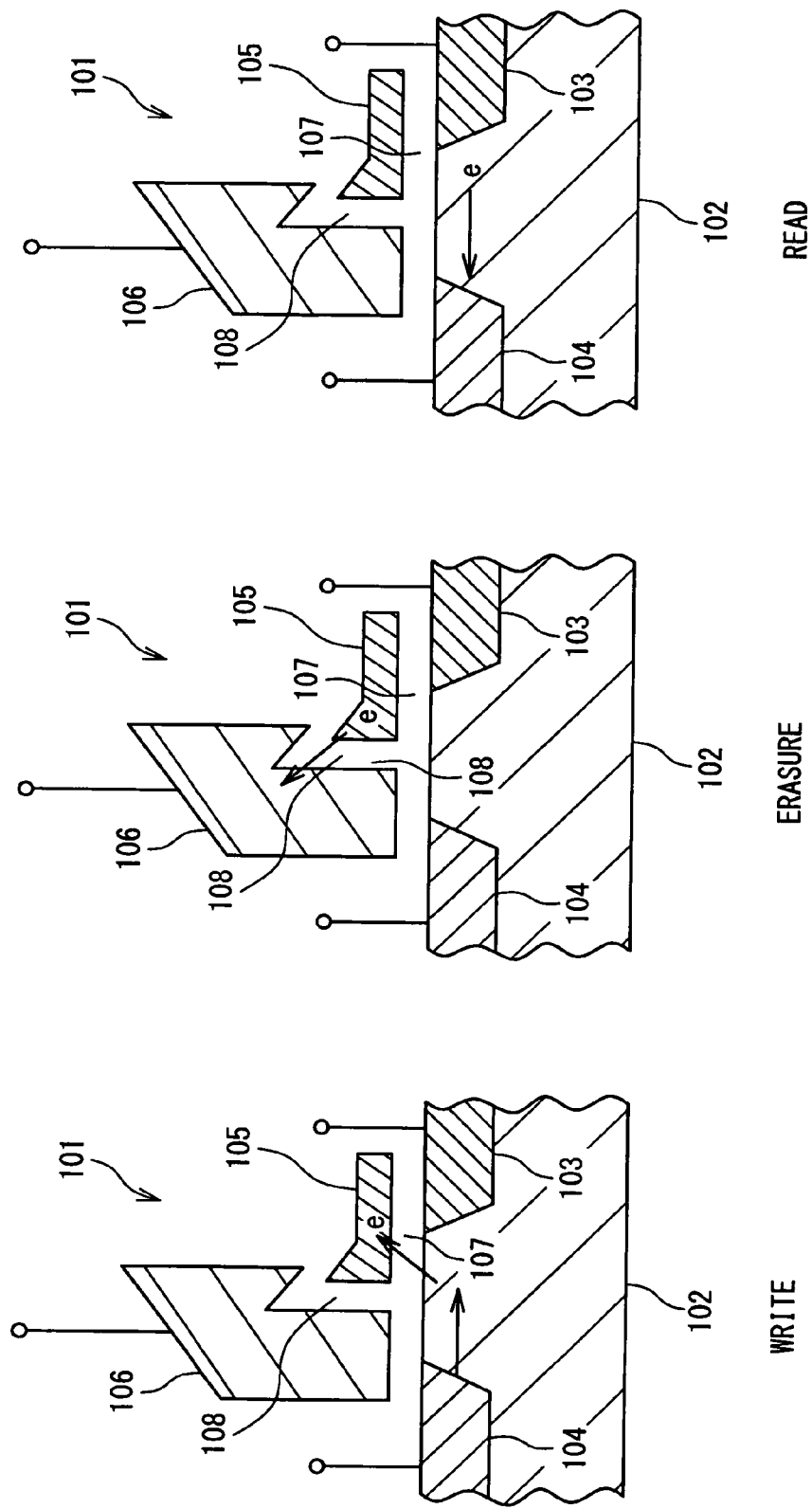

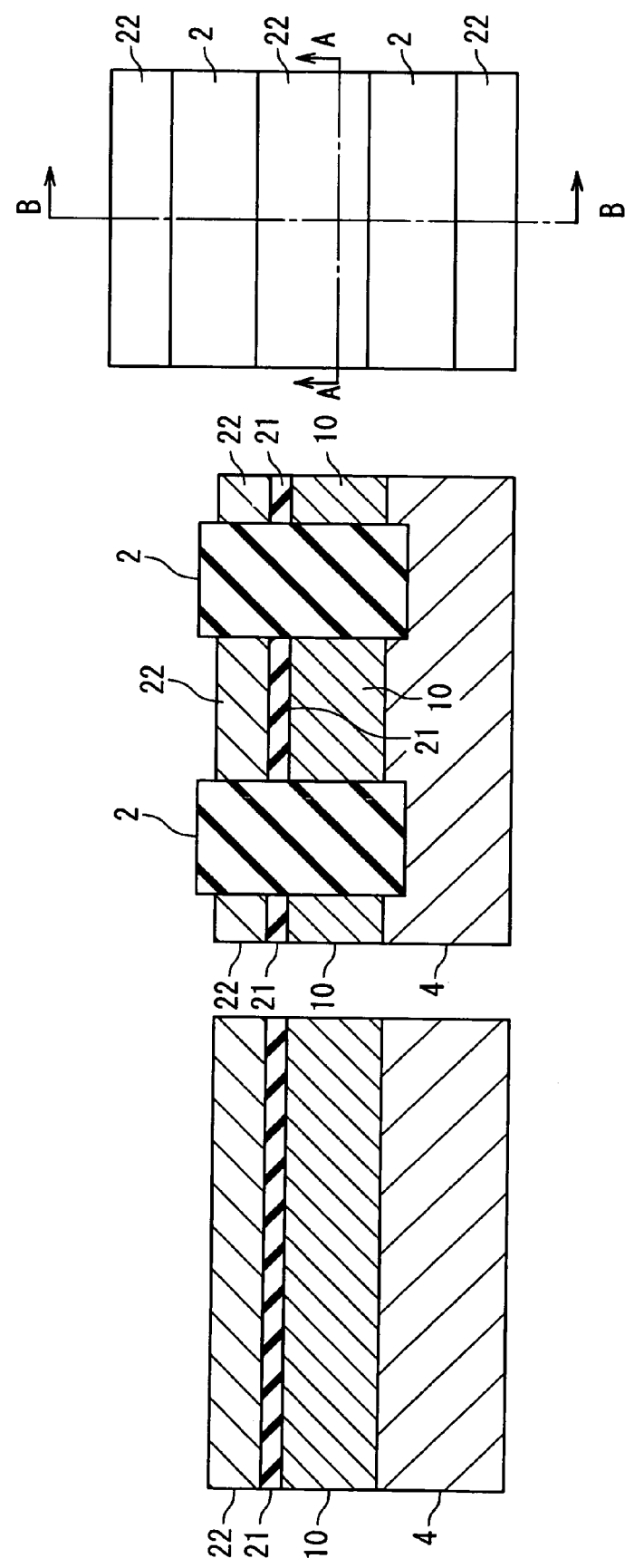

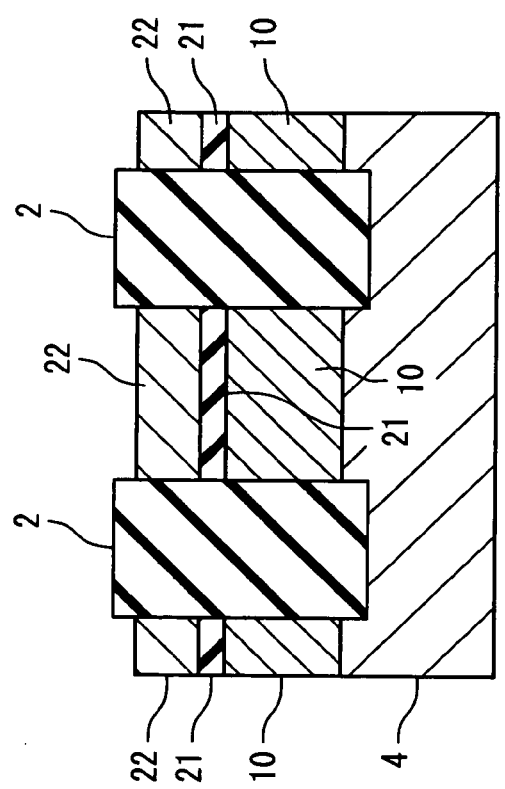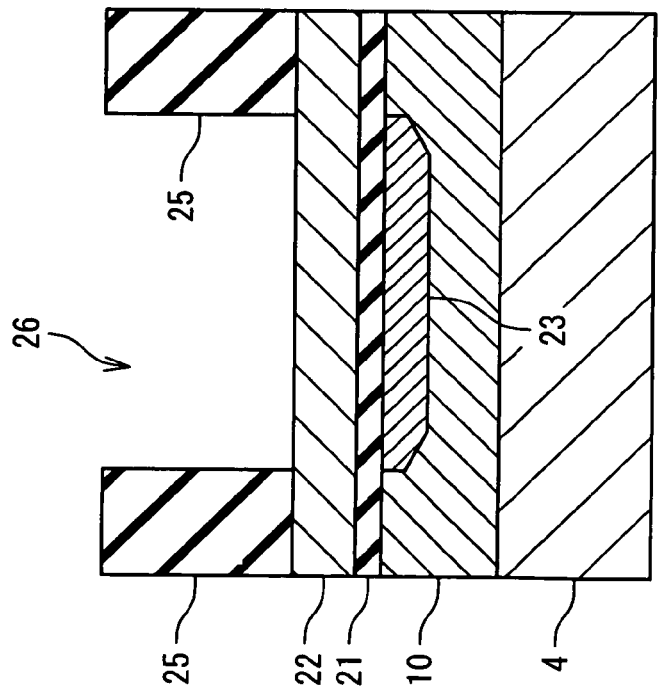

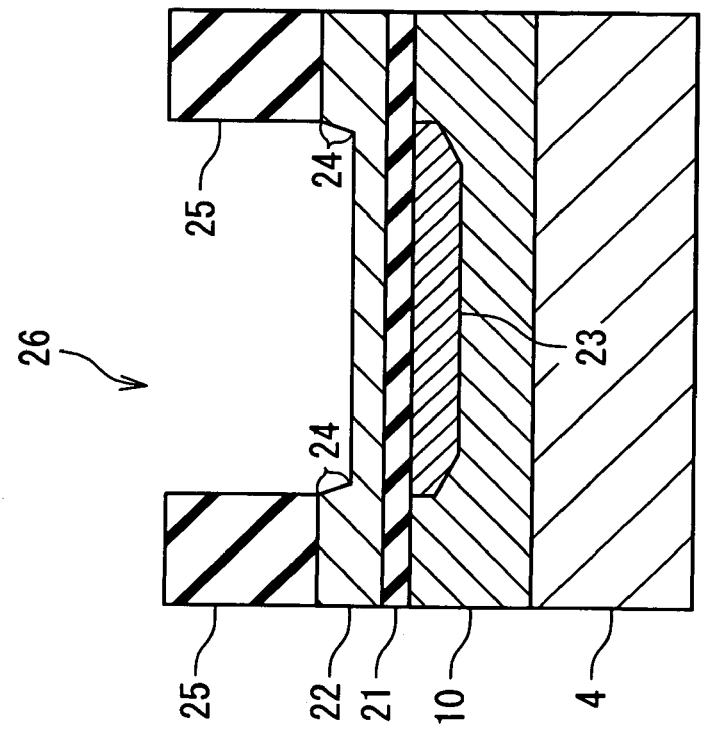
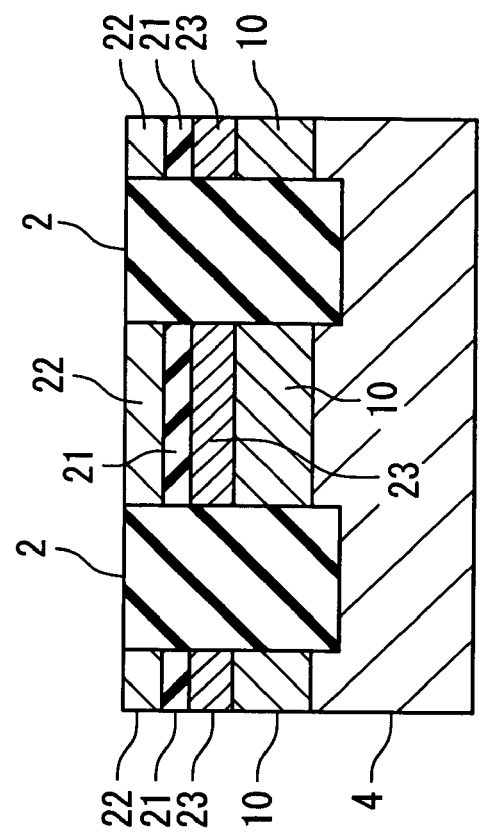

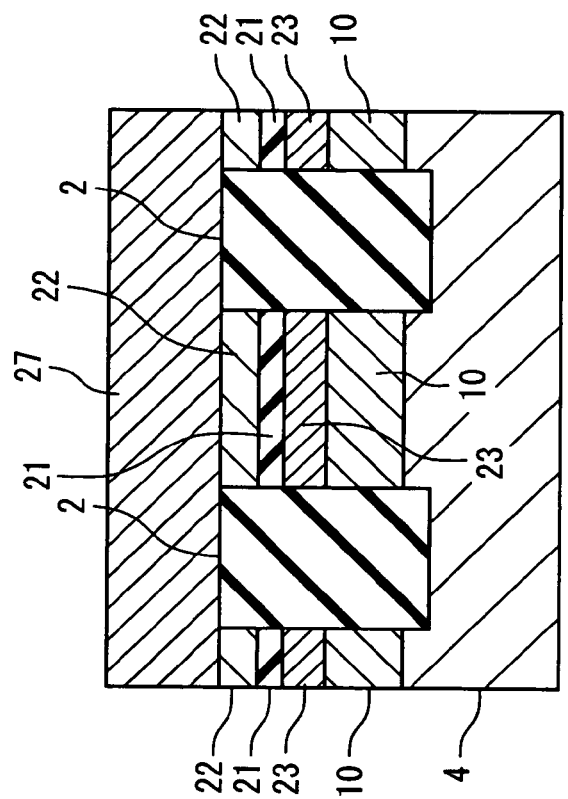
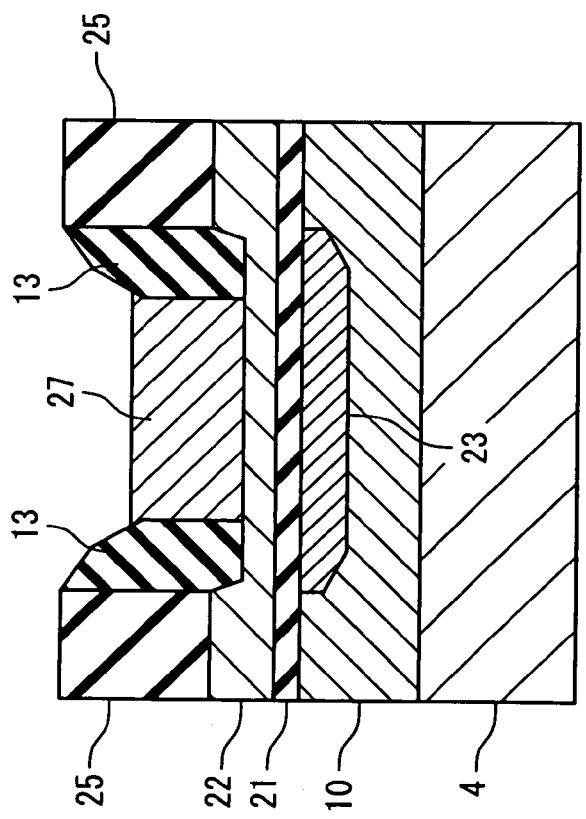
Fig. 6E-2
Fig. 6E-1

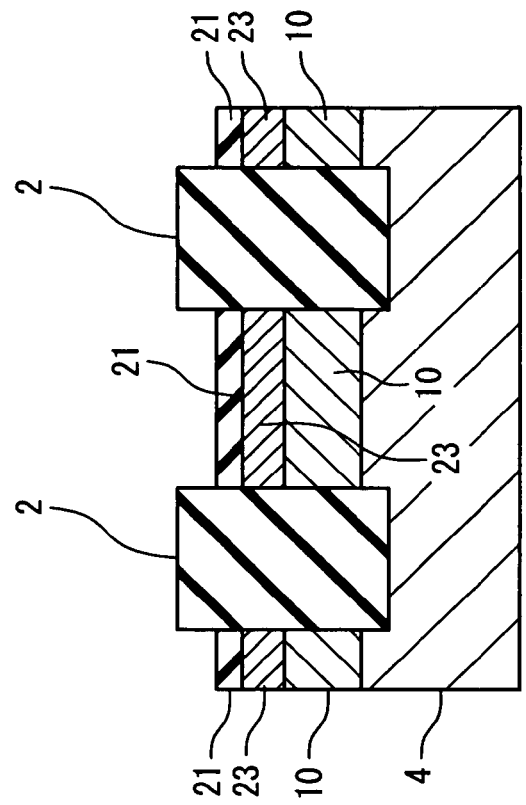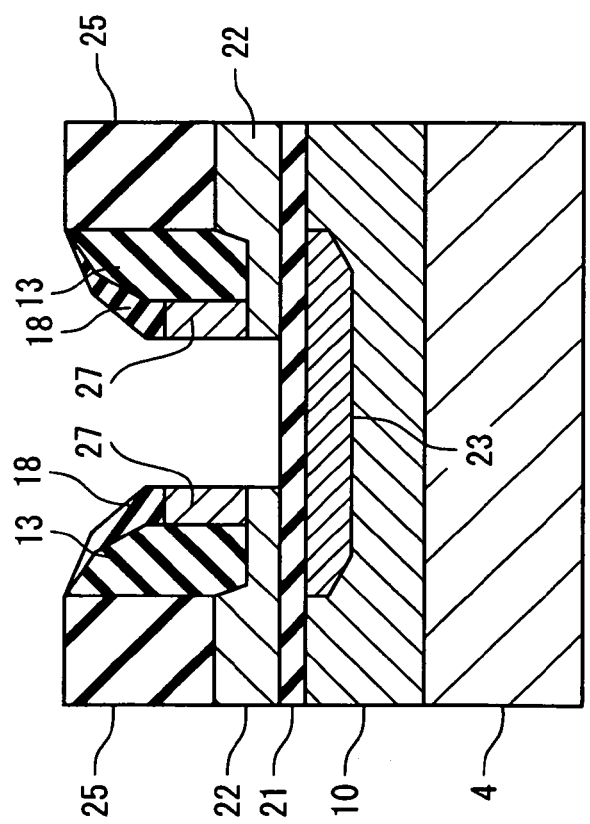

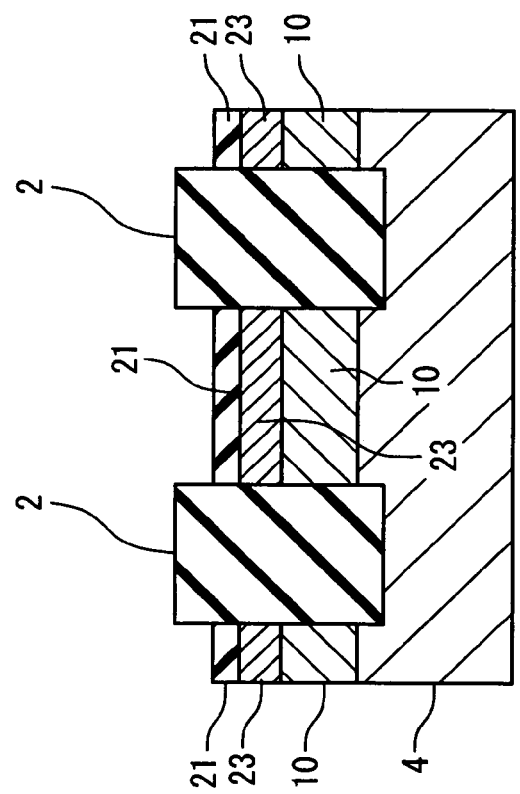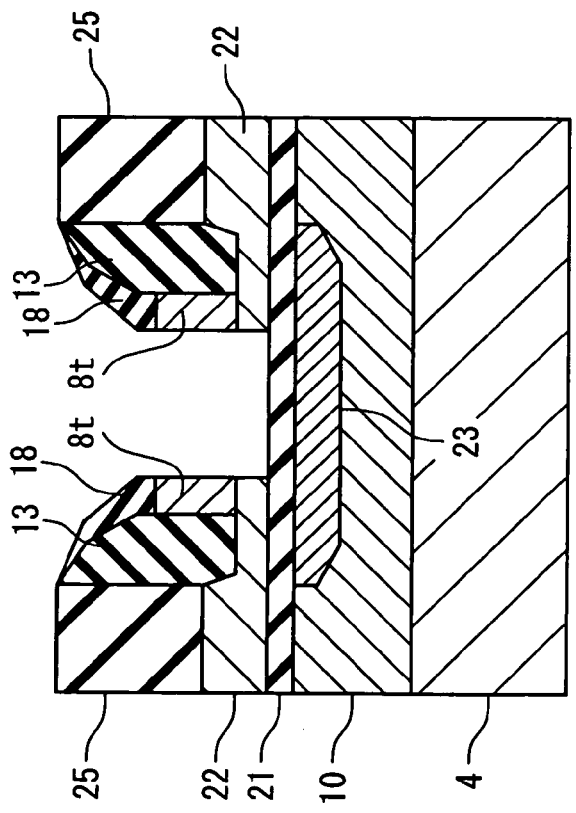
Fig. 6I-1
Fig. 6I-2

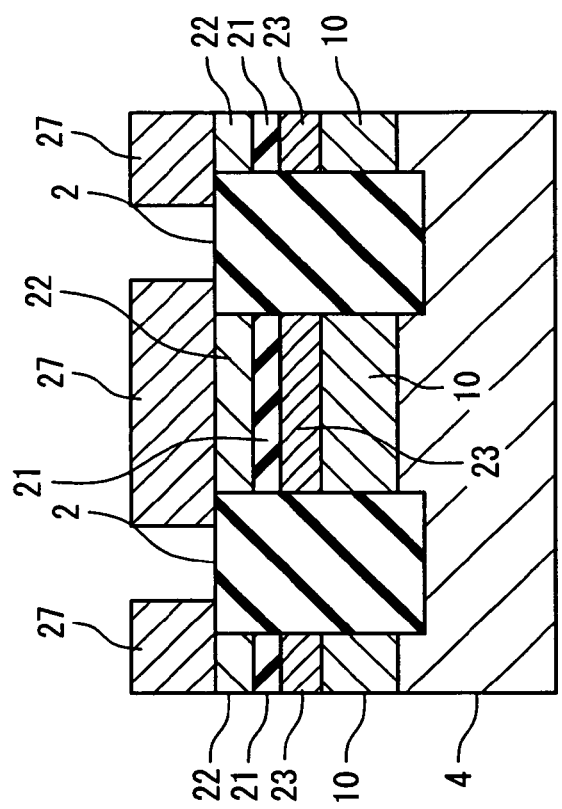
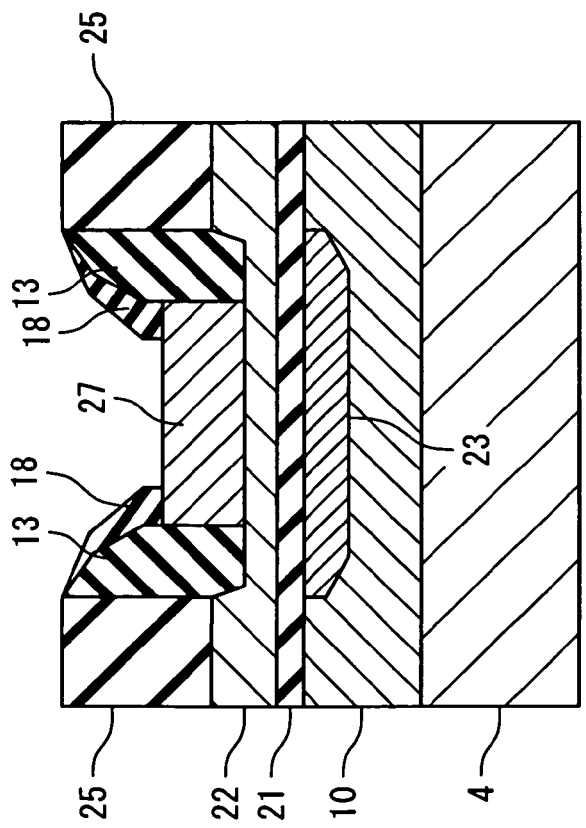
Fig. 7B-1
Fig. 7B-2

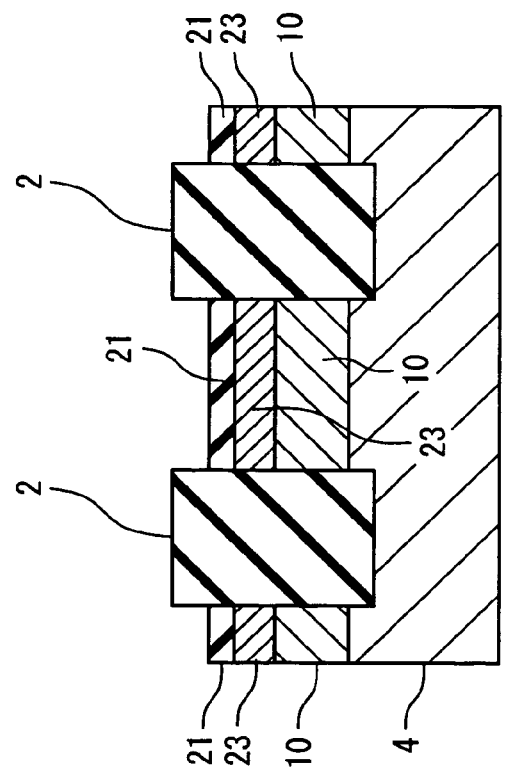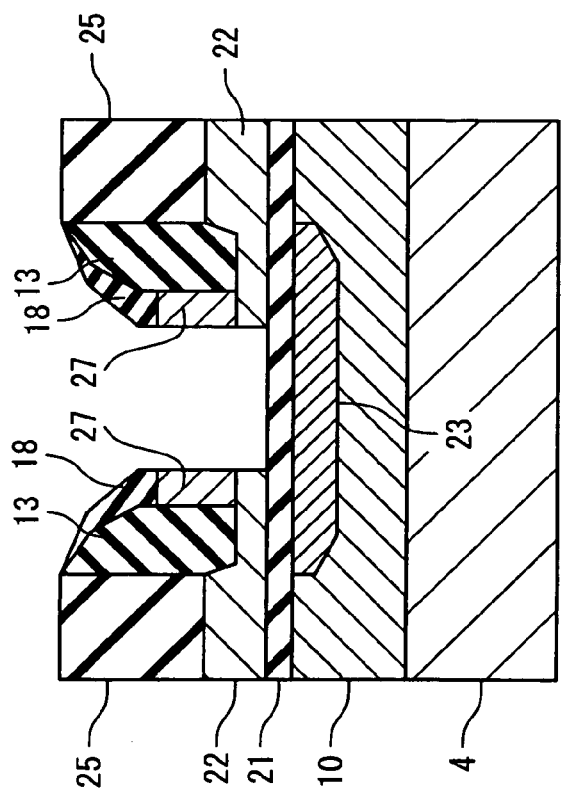

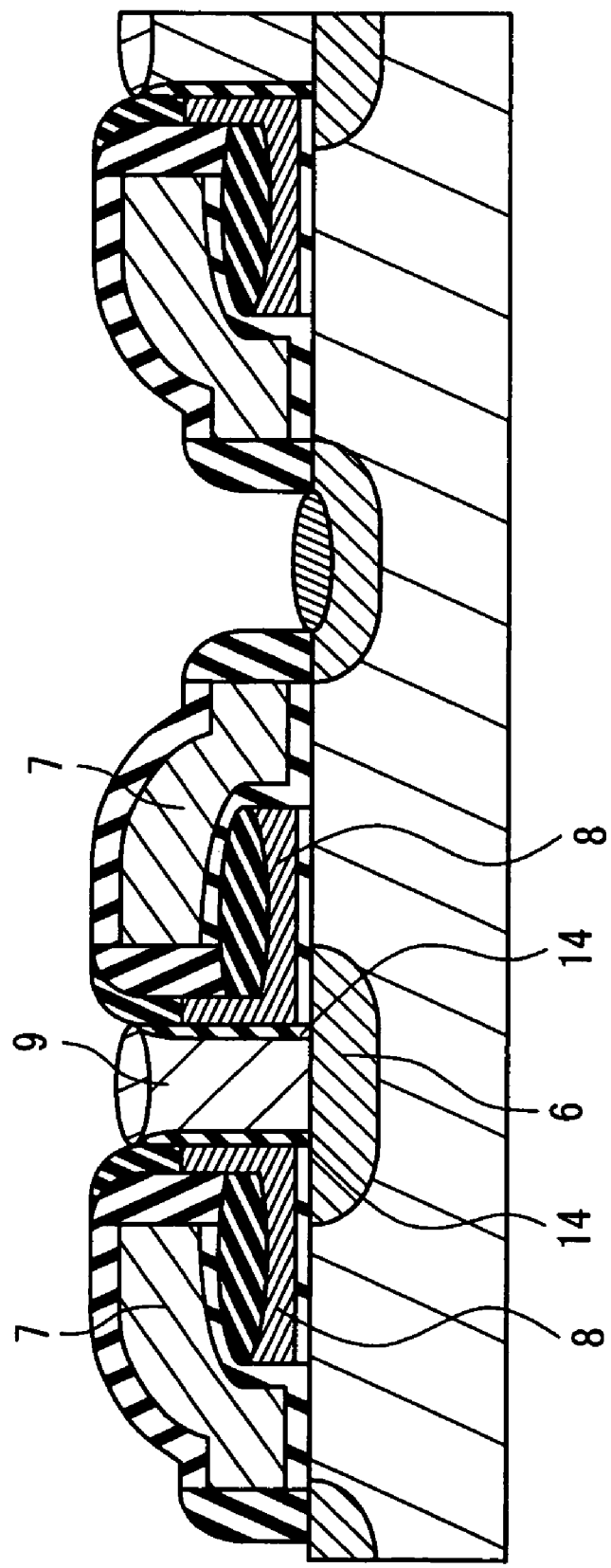

NONVOLATILE SEMICONDUCTOR MEMORY DEVICE AND MANUFACTURING METHOD THEREFOR

INCORPORATION BY REFERENCE

This Patent Application claims priority on convention based on Japanese Patent Application No. 2007-268005. The disclosure thereof is incorporated herein by reference.

BACKGROUND OF THE INVENTION

1. Field of the Invention

The present invention relates to a nonvolatile semiconductor memory device and a manufacturing method therefor.

2. Description of Related Art

As a nonvolatile semiconductor memory device in that a storage content is not erased even if power is turned off, a split gate type nonvolatile semiconductor memory device is known, as described in U.S. Pat. No. 6,525,371 B2. FIG. 1 is a cross-sectional view illustrating a configuration of the split gate type nonvolatile semiconductor memory device described in the above U.S. Pat. No. 6,525,371 B2. In this split gate type nonvolatile semiconductor memory device, a plurality of memory elements (hereinafter to be referred to as split gate type nonvolatile semiconductor memory cells 101) are formed.

As illustrated in FIG. 1, the split gate type nonvolatile semiconductor memory cell 101 is provided with a first source/drain diffusion layer 103 and second source/drain diffusion layers 104 which are formed on a substrate 102. Also, the nonvolatile semiconductor memory cell 101 is provided with floating gates 105 and control gates 106. The floating gate 105 is formed on the substrate 102 through a gate oxide film 107. Also, the control gate 106 is formed on the substrate 102 through a tunnel oxide film 108. Further, the tunnel oxide film 108 extends between the floating gate 105 and the control gate 106. A polysilicon plug 109 is formed on the first source/drain diffusion layer 103. The floating gate 105 is formed to have an acute angle portion. Also, a spacer 111 is formed on the floating gate 105.

An operation of the split gate type nonvolatile semiconductor memory cell 101 in U.S. Pat. No. 6,525,371 B2 will be described. FIGS. 2A to 2C are diagrams showing operations of a conventional split gate type nonvolatile semiconductor memory cell 101. Of the split gate type nonvolatile semiconductor memory cell 101, a write operation is shown in FIG. 2A, an erase operation in FIG. 2B, and a read operation in FIG. 2C.

As shown in FIG. 2A, when data is written in the split gate type nonvolatile semiconductor memory cell 101, the first source/drain diffusion layer 103 functions as a drain, and a relating one of the second source/drain diffusion layers 104 functions as a source. Upon the data write, the first source/drain diffusion layer 103 of the memory cell 101 is set to a higher voltage than the relating second source/drain diffusion layers 104. Thus, hot electrons (electrons in a high energy state) are generated on the source side of a channel, and are injected into the floating gate 105 through the gate oxide film 107. Such an operation is referred to as source side hot electron injection. Thus, the data is written. After the data is written, the floating gate is brought into a negatively charged state.

As shown in FIG. 2B, when data is erased from the memory cell 101, electrons are drawn out into the control gate 106 through the tunnel oxide film 108 by an FN tunneling current from the floating gate 105. Thus, the data is erased. That is, upon the erasure, the electrons are adapted to be drawn out from the floating gate 105 by applying a voltage to the control gate 106 to concentrate electric filed on a sharp tip portion (acute angle portion) of the floating gate 105. After the erasure, the floating gate is brought to a positively charged state.

As shown in FIG. 2C, when data is read from the memory cell 101, a predetermined voltage is applied to the control gate 106 to activate a transistor of the control gate 106, the first source/drain diffusion layer 103 as a source and the relating second source/drain diffusion layer 104 as a drain. At this time, current flowing between the source and the drain is varied based on the charges held in the floating gate 105. Thus, the data is read out.

As an information processing technique has been advanced, miniaturization of the split gate type nonvolatile semiconductor memory cell 101 is required.

When data is written in the split gate type nonvolatile semiconductor memory cell 101, a voltage of the floating gate 105 is increased through the functions of a capacitor formed between the first source/drain diffusion layer 103 and the floating gate 105. Accordingly, the floating gate 105 should be overlapped with the first source/drain diffusion layer 103 as seen from the above. If a size of the floating gate 105 is reduced along with the miniaturization of the memory cell 101, an overlap region between the first source/drain diffusion layer 103 and the floating gate 105 is also reduced. The reduction of the overlap region may cause a problem in the data write. A technique capable of appropriately writing data while reducing the size of the floating gate 105 is known in Japanese Patent Application Publication (JP-P2004-289161A).

FIG. 3 is a cross-sectional view illustrating a configuration of a floating gate type memory cell array described in Japanese Patent Application Publication (JP-P2004-289161A). In the memory cell array, each memory cell includes a trench formed in a surface region of a semiconductor substrate 210. A memory cell is provided with a source region 258 formed under the trench. A polysilicon block 260 is connected to the source region 258. Further, the memory cell is provided with a drain region 280 formed along a surface of the substrate 210. A channel region 204 is provided between the source and drain regions 258 and 280. The channel region 204 includes a first portion 204a vertically extending along a sidewall of the trench, a second portion 204b horizontally extending along the surface of the substrate, and a third portion 204c extending from the first portion 204a to the source region 258.

A floating gate 246a of the memory cell is arranged in a trench to be adjacent to and insulated from the first portion 204a of the channel region 204. A control gate 268 is arranged on the second portion 204b of the channel region 204 to be insulated from the second portion 204b. A sidewall of the trench intersects with the substrate surface at an acute angle, and thereby a sharp edge is formed. The second portion 204b of the channel region 204 extends toward the sharp edge and the floating gate from the second portion 204b to define a path for programming the floating gate through hot electron injection.

The floating gate type memory cell described in Japanese Patent Application Publication (JP-P2004-289161A) is provided with the floating gate 246a formed in the trench, and the polysilicon block 260 buried inside the substrate 210. Also, the floating gate 246a and the poly block 260 are both buried in the substrate, and an area of a portion opposing to each other is increased. Thus, the floating gate 246a is set to a higher voltage than a voltage of the source region 258 based on capacitive coupling between the polysilicon block 260 and the floating gate 246a.

As described above, in the floating gate type memory cell, a first capacitor is formed by the floating gate 246a and an overlapping portion of it with the source region 258. Also, a second capacitor is formed by the floating gate 246a and an overlapping portion of it with the polysilicon block 260. The floating gate type memory cell increases a voltage of the floating gate 246a through functions of the first and second capacitors.

Also, the trench is formed in the substrate 210 to form the second capacitor. The polysilicon block 260 is formed to extend in a depth direction of the trench. Also, the floating gate 246 is formed to extend in a depth direction of the trench.

The trench depths and widths of all of the memory cells are adaptive to respectively have the same values to increase a voltage of the floating gate 246a through the function of the second capacitor 2 to appropriately operate the floating gate type memory cell.

Also, the channel region of the floating gate type memory cell is formed by implanting impurities into the substrate. The impurities to be implanted into the substrate are required to be uniformly implanted into the substrate. As described above, the channel region of a conventional floating gate type memory cell is formed in the depth direction along a sidewall of the trench. For all of the memory cells, it is extremely difficult to uniformly implant the impurities in the depth direction.

SUMMARY

In an aspect of the present invention, a nonvolatile semiconductor memory device includes a floating gate formed on a semiconductor substrate through a gate insulating film, and having a first portion contacting the gate insulating film and a second portion extending upwardly from a part of a surface of the first portion; and a first diffusion layer formed in the semiconductor substrate, and having a plane parallel to a surface of the semiconductor substrate; a second diffusion layer formed in the semiconductor substrate, and having the plane. A control gate is provided near the floating gate above a channel region in the semiconductor substrate and is formed on a first side of the first portion. A conductive film is connected with the first diffusion layer and is formed on a second side of the first portion and a first side of the second portion through the first insulating film.

In another aspect of the present invention, a nonvolatile semiconductor memory device includes a floating gate formed on a surface of a semiconductor substrate through a gate insulating film; a first diffusion layer formed in the semiconductor substrate; and a second diffusion layer formed in the semiconductor substrate. A control gate is formed to oppose to a first side of the floating gate. A conductive film is connected with the first diffusion layer and is formed on the surface of the semiconductor substrate to oppose to a second side of the floating gate, the second side being opposite to the first side. A first insulating film is formed between the second side and the conductive film. An area of the second side is wider than that of the first side.

In still another aspect of the present invention, a method of manufacturing a nonvolatile semiconductor memory device, is achieved by forming device separation insulating films in a semiconductor substrate which is covered with a first insulating film and a first conductive film for a floating gate; by forming a nitride film on the first conductive film and the device separation insulating films to have an opening in a direction different from a direction in which the device separation insulating films extend; by forming first spacer insulating films on side surfaces of the opening in a shape of side wall; by forming a second conductive film for a floating gate between the first spacer insulating films; by forming a second insulating layer on surfaces of the second conductive film and the first spacer insulating films; by etching back the second insulating layer to form second spacer insulating films on the second conductive film of a side wall shape; by removing the first conductive film, the second conductive film, and the first insulating film by using the second spacer insulating films as a mask; by forming third spacer insulating films on a side surface of the first conductive film and the second conductive film; by forming a diffusion layer in a portion of the semiconductor substrate corresponding to the opening and forming a third conductive film on the diffusion layer; and by forming a floating gate with the first conductive film and the second conductive film by selectively removing the first conductive film by using the first spacer insulating films as a mask after removing the nitride film.

According to the present invention, coupling between a floating gate and a polysilicon plug can be enhanced. As a result, an overlap area between a source diffusion layer and the floating gate can be reduced, and therefore a cell size can be appropriately reduced without forming a trench.

BRIEF DESCRIPTION OF THE DRAWINGS

The above and other objects, advantages and features of the present invention will be more apparent from the following description of certain embodiments taken in conjunction with the accompanying drawings, in which:

FIGS. 2A to 2C are diagrams showing operations of the conventional split gate type nonvolatile semiconductor memory cell;

FIGS. 6A-1 to 6A-3 are views in a first process for manufacturing the split gate type nonvolatile semiconductor memory device of the first embodiment;

FIGS. 6B-1 and 6B-2 are views in a second process for manufacturing the split gate type nonvolatile semiconductor memory device of the first embodiment;

FIGS. 6C-1 and 6C-2 are views in a third process for manufacturing the split gate type nonvolatile semiconductor memory device of the first embodiment;

FIGS. 6D-1 and 6D-2 are views in a fourth process for manufacturing the split gate type nonvolatile semiconductor memory device of the first embodiment;

FIGS. 6E-1 and 6E-2 are views in a fifth process for manufacturing the split gate type nonvolatile semiconductor memory device of the first embodiment;

FIGS. 6F-1 and 6F-2 are views in a sixth process for manufacturing the split gate type nonvolatile semiconductor memory device of the first embodiment;

FIGS. 6G-1 to 6G-5 are views in a seventh process for manufacturing the split gate type nonvolatile semiconductor memory device of the first embodiment;

FIGS. 6I-1 to 6I-5 are views in a ninth process for manufacturing the split gate type nonvolatile semiconductor memory device of the first embodiment;

FIGS. 6J-1 and 6J-2 are views in a tenth process for manufacturing the split gate type nonvolatile semiconductor memory device of the first embodiment;

FIGS. 6K-1 and 6K-2 are views in an eleventh process for manufacturing the split gate type nonvolatile semiconductor memory device of the first embodiment;

FIGS. 6L-1 and 6L-2 are views in a twelfth process for manufacturing the split gate type nonvolatile semiconductor memory device of the first embodiment;

FIGS. 6M-1 and 6M-2 are views in a thirteenth process for manufacturing the split gate type nonvolatile semiconductor memory device of the first embodiment;

FIGS. 6N-1 and 6N-2 are views in a fourteenth process for manufacturing the split gate type nonvolatile semiconductor memory device of the first embodiment;

FIG. 6O is a view in a fifteenth process for manufacturing the split gate type nonvolatile semiconductor memory device of the first embodiment;

FIGS. 7A-1 to 7A-5 are views in a first process for manufacturing the split gate type nonvolatile semiconductor memory device according to a second embodiment of the present invention;

FIGS. 7B-1 to 7B-5 are views in a second process for manufacturing the split gate type nonvolatile semiconductor memory device of the second embodiment;

FIGS. 7C-1 and 7C-2 are views in a third process for manufacturing the split gate type nonvolatile semiconductor memory device of the second embodiment;

FIG. 8 is a cross-sectional view of the split gate type nonvolatile semiconductor memory device according to a third embodiment of the present invention.

DESCRIPTION OF THE PREFERRED EMBODIMENTS

Hereinafter, a nonvolatile semiconductor memory device of the present invention will be described using a split gate type nonvolatile semiconductor memory device as an example in detail with reference to the attached drawings.

[First Embodiment]

Figure 4:
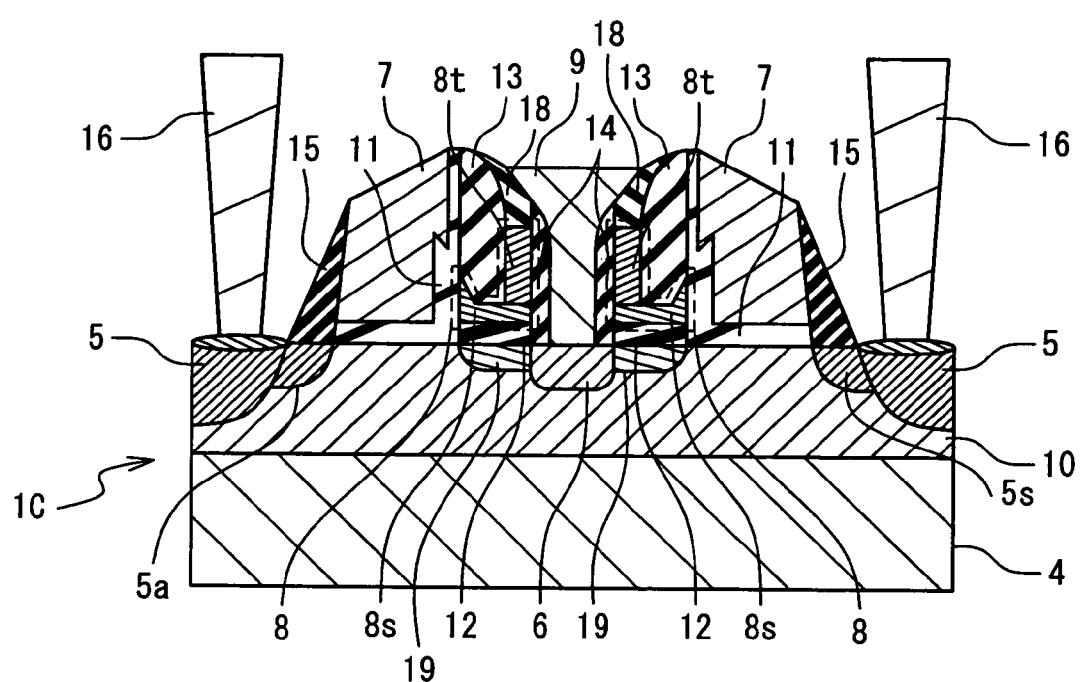
FIG. 4 is a cross-sectional view of a split gate type nonvolatile semiconductor memory device according to a first embodiment of the present invention.

FIG. 4 is a cross-sectional view showing a configuration of a split gate type nonvolatile semiconductor memory device 1 as the nonvolatile semiconductor memory device according to a first embodiment of the present invention (hereinafter referred to as). In the split gate type nonvolatile semiconductor memory device 1 of the first embodiment, channel hot electrons generated in a substrate are injected to a floating gate in a write operation. Also, the electrons are drawn out from the floating gate to a control gate in an erase operation. Further, a read voltage is applied to the control gate to detect a state of a memory cell (ON or OFF).

Referring to FIG. 4, the split gate type nonvolatile semiconductor memory device 1 of the first embodiment contains first and second memory cells 1C which are formed symmetrically with respect to a plane. The first and second memory cells 1C are manufactured in a self-alignment manner. The nonvolatile semiconductor memory cells operate independently from each other. In the following description, in order to facilitate the understanding of the present invention, the two memory cells formed symmetrically with respect to a plane are referred to as nonvolatile semiconductor memory cells 1C to describe the split gate type nonvolatile semiconductor memory device 1. Each of the memory cells 1C includes a first source/drain diffusion layer 5 and 5s, a second source/drain diffusion layer 6 and 19, a control gate 7, and a floating gate 8 (8s and 8t). The first source/drain diffusion layer 5 and 5s and the second source/drain diffusion layer 6 and 19 are formed in a well 10 of a semiconductor substrate 4. The semiconductor substrate 4 includes a channel region between the second source/drain diffusion layer 6 and 19 and the first source/drain diffusion layer 5 and 5s. It should be noted that in the following description, the semiconductor substrate 4 is assumed to be a p-type semiconductor substrate. This does not mean that the semiconductor substrate 4 in the present invention is limited to the p-type semiconductor substrate.

The second source/drain diffusion layer 6 and 19 is implanted with impurity. The second source/drain diffusion layer 6 and 19 functions as a drain when a data is written in the memory cell 1C, and as a source when the data is read out from the memory cell 1C. The first source/drain diffusion layer 5 and 5s is implanted with impurity, similarly to the second source/drain diffusion layer 6 and 19. The first source/drain diffusion layer 5 and 5s functions as a source when the data is written in the memory cell 1C, and as a drain when the data is read out from the memory cell 1C.

The floating gate 8 includes a first floating gate section 8s and a second floating gate section 8t. The second floating gate section 8t is formed to protrude upward from the first floating gate section 8s as a base. The first floating gate section 8s and the second floating gate section 8t are integrally formed. The second floating gate section 8t is formed on the first floating gate section 8s. The first floating gate section 8s is formed on the semiconductor substrate 4 through a gate insulating film 12. The first floating gate section 8s is formed such that the first floating gate section 8s is adjacent to the control gate 7 through a tunnel insulating film 11. The first spacer insulating film 13 is formed on the first floating gate section 8s. A second spacer insulating film 18 is formed on the second floating gate section 8t. A side surface of the second floating gate section 8t on the control gate side is in contact with the first spacer insulating film 13. A side surface of the first floating gate section 8s and a side surface of the second floating gate section 8t on the polysilicon plug 9 side are formed to be in contact with the polysilicon plug 9 through a third spacer insulating film 14.

Accordingly, the floating gate 8 is electrically insulated from other conductive sections by the gate insulating film 12, the tunnel insulating film 11, the first spacer insulating film 13, the second spacer insulating film 18, and the third spacer insulating film 14. In the nonvolatile semiconductor memory cell 1C, the polysilicon plug 9, the third spacer insulating film 14, and the floating gate 8 form a capacitor. Since the second floating gate section 8t protrudes upward, a capacitance of the capacitor increases. Also, the first floating gate section 8s includes an acute angle portion on the control gate 7 side. The acute angle portion of the first floating gate section 8s has an angle by which a data erasing operation can be accurately and stably performed.

The control gate 7 is formed on the semiconductor substrate 4 through the tunnel insulating film 11. The polysilicon plug 9 is formed on the second source/drain diffusion layer 6, which is common to the two memory cells 1C. Also, a CGB region 19 is formed through the gate insulating film 12 below the first floating gate section 8s. The first source/drain diffusion layer 5 is connected to a contact 16 through a silicide layer formed on the first source/drain diffusion layer 5. The contact 16 is connected to an upper layer wiring (not shown). Also, the contact 16 supplies a predetermined voltage to the first source/drain diffusion layer 5 and 5s through the silicide layer. Further, a silicide layer (not shown) is formed on an upper surface of the control gate 7, and an LDD (lateral diffused dopants) sidewall 15 is formed on a side surface of the control gate 7. Still further, an LDD region 5s is formed in the substrate under the LDD sidewall 15. Yet further, a polysilicon plug silicide layer (not shown) is formed on an upper surface of the polysilicon plug 9.

Figure 5:
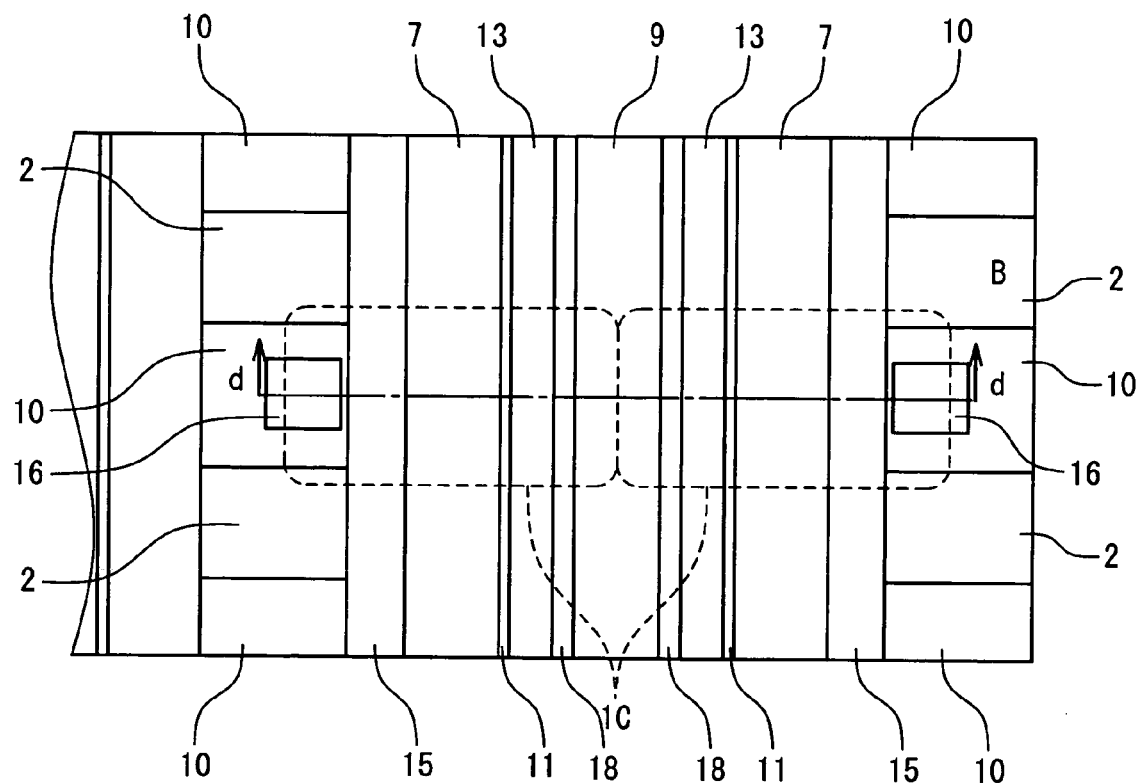
FIG. 5 is a plan view of the split gate type nonvolatile semiconductor memory device in the first embodiment.

FIG. 5 is a plan view showing a configuration of the split gate type nonvolatile semiconductor memory device 1. The nonvolatile semiconductor memory device 1 is provided with a plurality of the nonvolatile semiconductor memory cells 1C. The plurality of memory cells 1C are respectively isolated from each other by STI (Shallow Trench Isolations) structures (hereinafter to be described as element isolating insulating films 2) extending in a direction of a bit line. In other words, the nonvolatile semiconductor memory cell 1C is formed between two element isolating insulating films 2.

The control gate 7 and the polysilicon plug 9 are formed to extend in a direction of a word line. The tunnel insulating film 11 and the first spacer insulating film 13 are formed between the control gate 7 and the polysilicon plug 9. Also, the LDD sidewall 15 is formed on the side surface of the control gate 7 on the side of the first source/drain diffusion layer 5. Further, the split gate type nonvolatile semiconductor memory device 1 includes the first source/drain diffusion layer 5 and 5s. The first source/drain diffusion layer 5 and 5s is formed in the well 10 and connected with the contact 16. It should be noted that FIG. 4 illustrates a cross section along the line d-d in FIG. 5.

Figure 1:
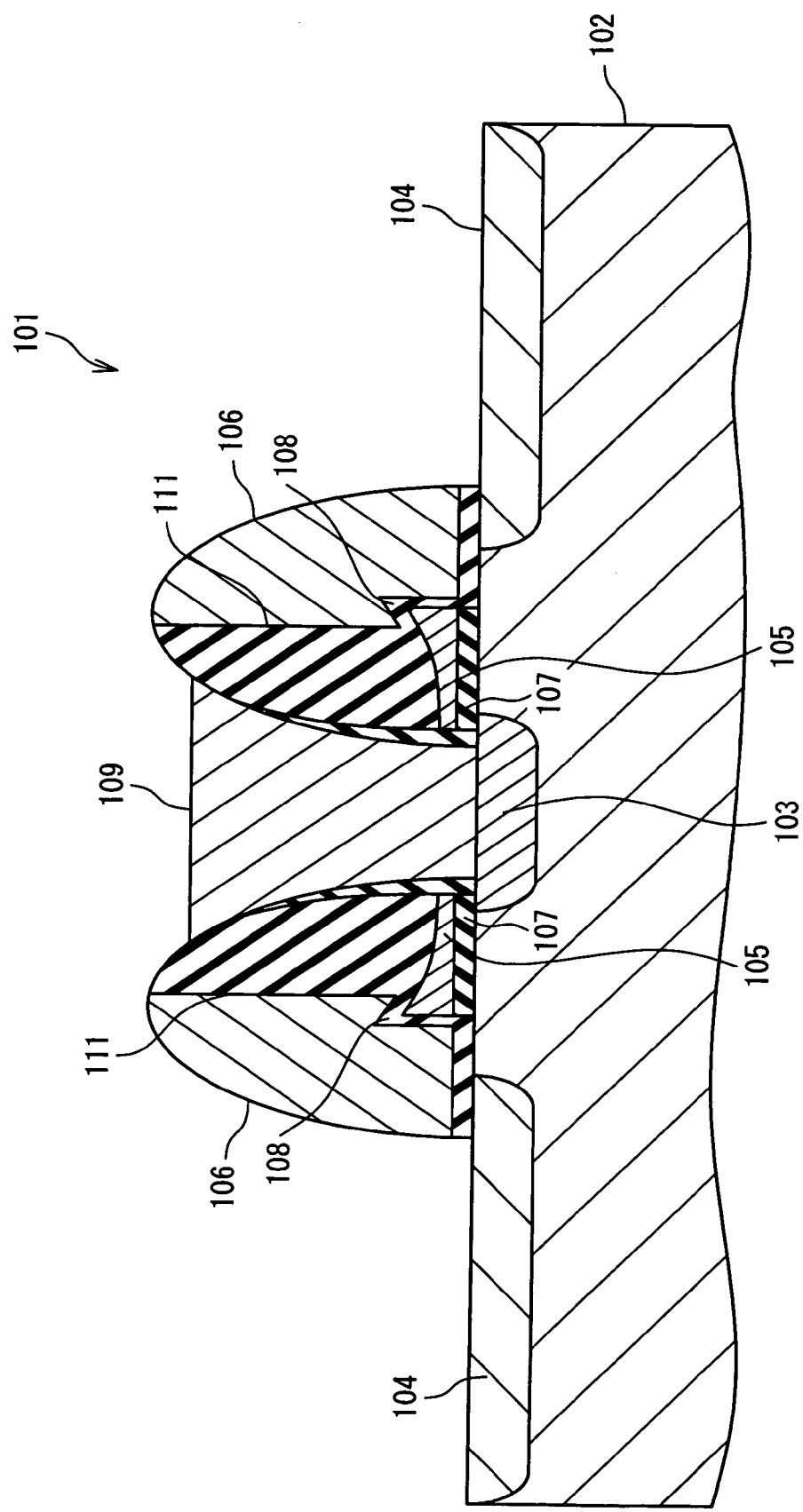
FIG. 1 is a cross-sectional view of a conventional split gate type nonvolatile semiconductor memory device.
Figure 3:
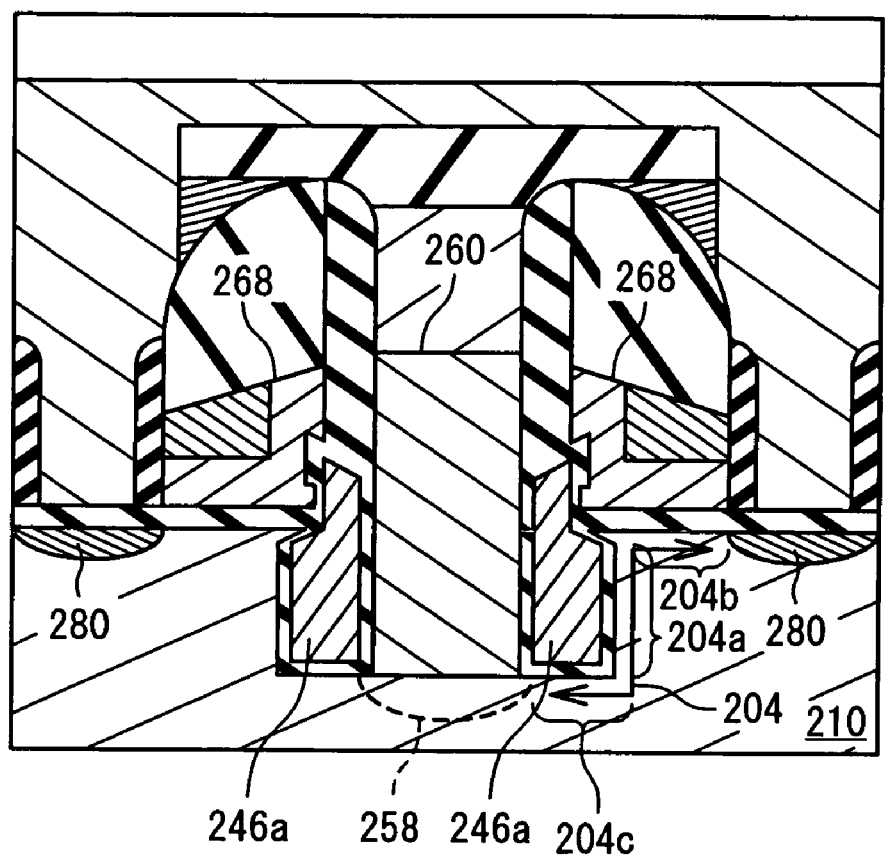
FIG. 3 is a cross-sectional view of another conventional floating gate type memory cell array.
Figures 2, 6D:
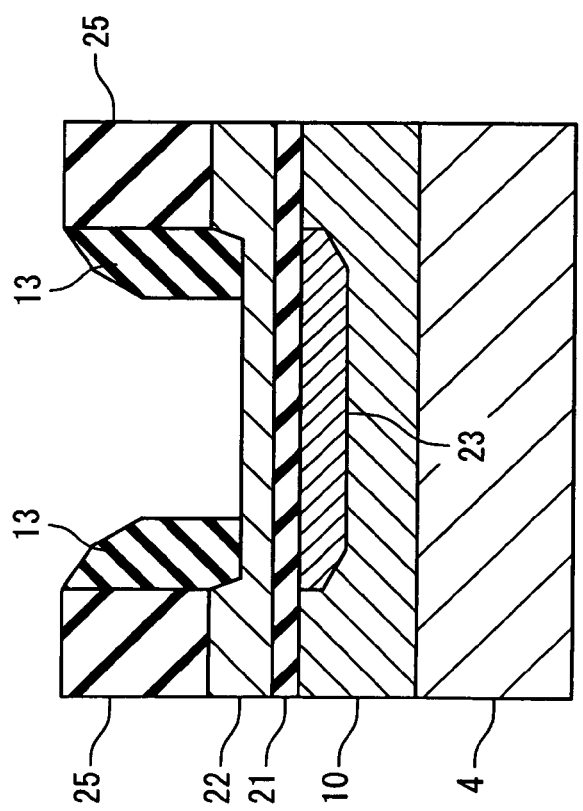
Figures 1, 6D:
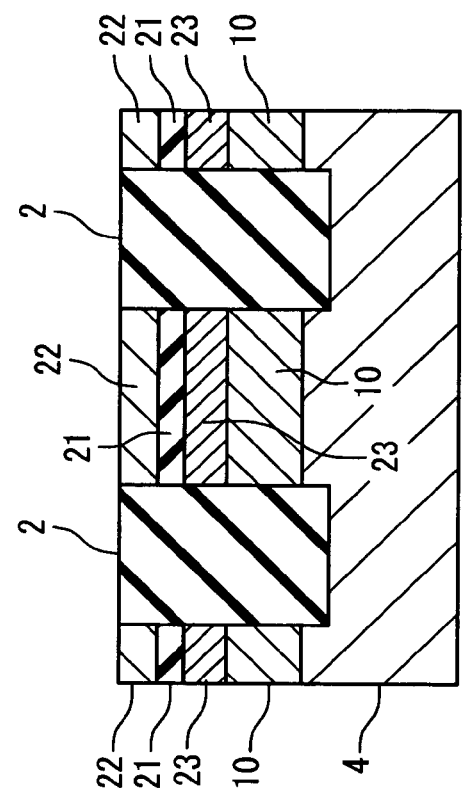

Hereinafter, a manufacturing process of the split gate type nonvolatile semiconductor memory device 1 according to the first embodiment of the present invention will be described. FIGS. 6A-1 to 6A-3 are diagrams showing the semiconductor memory device 1 in a first process of manufacturing the split gate type nonvolatile semiconductor memory device 1. FIG. 6A-3 is a plan view showing a configuration of the semiconductor memory device 1 in the first process. FIG. 6A-1 is a sectional view of the split gate type nonvolatile semiconductor memory device along the line A-A in FIG. 6A-3. FIG. 6A-2 is a sectional view of the split gate type nonvolatile semiconductor memory device 1 along the line B-B in FIG. 6A-3.

In the first process, as illustrated in FIGS. 6A-1 and 6A-2, a layer 21 for a gate insulating film is first formed on the semiconductor substrate 4. A first polysilicon layer 22 is formed on the layer 21 for the gate insulating film. The layer 21 for the gate insulating film is preferably formed to have the thickness of approximately 8 nm. Also, the first polysilicon layer 22 is preferably formed to have the thickness of approximately 80 to 100 nm. Then, a field nitride layer (not shown) is formed on a first polysilicon layer 22, and impurity is implanted to form the well 10. Then, a field nitride layer (not shown) is removed to expose a surface of the first polysilicon layer 22. That is, etching is preformed according to a resist pattern to form trenches. The trenches have been filled with an element isolating insulating material, and then first element isolating insulating films 2 are polished by CMP (Chemical Mechanical Polishing). Thus, the element isolating insulating films 2 are formed to isolate the plurality of nonvolatile semiconductor memory cells 1C from each other in the word line direction.

Next, FIGS. 6B-1 and 6B-2 are diagrams showing the semiconductor memory device in a second process of a method of manufacturing the split gate type nonvolatile semiconductor memory device 1. FIG. 6B-1 is a sectional view of the split gate type nonvolatile semiconductor memory device 1 along the line A-A of FIG. 6A-3 in the second process. FIG. 6B-2 is a sectional view of the split gate type nonvolatile semiconductor memory device 1 along the line B-B of FIG. 6A-3 in the second process.

In the second process, as shown in FIGS. 6B-1 and 6B-2, a layer 25 for first spacer nitride films is formed on the first polysilicon layer 22. Then, a part of the layer 25 for the first spacer nitride films is removed to form an opening 26 which extends in a word line direction. Thus, the first spacer nitride films 25 are formed. Then, by using the first spacer nitride films 25 as a mask, impurity such as boron is ion-implanted into a portion of the well 10 corresponding to the opening 26 to form a diffusion layer 23. It should be noted that the first spacer nitride layer 25 is formed on the first element isolating insulating film 2 and first polysilicon film 22 in a region other than the opening 26.

Next, FIGS. 6C-1 and 6C-2 are diagrams showing the semiconductor memory device 1 in a third process of a method of manufacturing the split gate type nonvolatile semiconductor memory device 1. FIG. 6C-1 is a sectional view of the split gate type nonvolatile semiconductor memory device along the line A-A in FIG. 6A-3 in the third process. FIG. 6C-2 is a sectional view of the split gate type nonvolatile semiconductor memory device along the line B-B in FIG. 6A-3 in the third process.

In the third process, as shown in FIGS. 6C-1 and 6C-2, the first polysilicon layer 22 near side surfaces of the first spacer nitride films 25 is etched to have slope portions. Thus, the thickness of the first polysilicon layer 22 corresponding to the bottom of the opening 26 is reduced. At this time, the upper surfaces of the element isolating insulating films 2 are also etched by the etching. Preferably, slope portions 24 formed through the etching have a shape having a taper angle of, for example, 45 degrees. The slope portion 24 is used for the acute angle portion of the first floating gate section 8s on the control gate 7 side.

Next, FIGS. 6D-1 and 6D-2 are diagrams showing the semiconductor memory device in a fourth process of a method of manufacturing the split gate type nonvolatile semiconductor memory device 1. FIG. 6D-1 is a sectional view of the split gate type nonvolatile semiconductor memory device along the line A-A in FIG. 6A-3 in the fourth process. FIG. 6D-2 is a sectional view of the split gate type nonvolatile semiconductor memory device along the line B-B in FIG. 6A-3 in the fourth process.

In the fourth process, firstly, an oxide layer is formed by an LPCVD method on the surface of the first polysilicon layer 22. Then, the oxide film is etched by using a dry etching method to form first spacer insulating films 13. It should be noted that as illustrated in FIG. 6D-2, the structure of the split gate type nonvolatile semiconductor memory device in the fourth process is the same as that in the above-described third process.

Next, FIGS. 6E-1 and 6E-2 are diagrams showing the semiconductor memory device in a fifth process of a method of manufacturing the split gate type nonvolatile semiconductor memory device 1. FIG. 6E-1 is a sectional view of the split gate type nonvolatile semiconductor memory device along the line A-A in FIG. 6A-3 in the fifth process. FIG. 6E-2 is a sectional view of the split gate type nonvolatile semiconductor memory device along the line B-B in FIG. 6A-3 in the fifth process.

In the fifth process, as shown in FIGS. 6E-1 and 6E-2, a polysilicon layer having a predetermined thickness is formed by a CVD method. Then, after the polysilicon layer is polished by a CMP method, it is etched to a predetermined thickness to form a second polysilicon film 27 for a second floating gate section. The second polysilicon film 27 is designed depending on a height of the first spacer nitride film 25. If the height of the first spacer nitride film 25 is approximately 400 nm, the second polysilicon film 27 preferably has the thickness of approximately 200 nm. In the fifth process, the second polysilicon film 27 is formed without being isolated in the word line direction.

Figures 2, 6F:
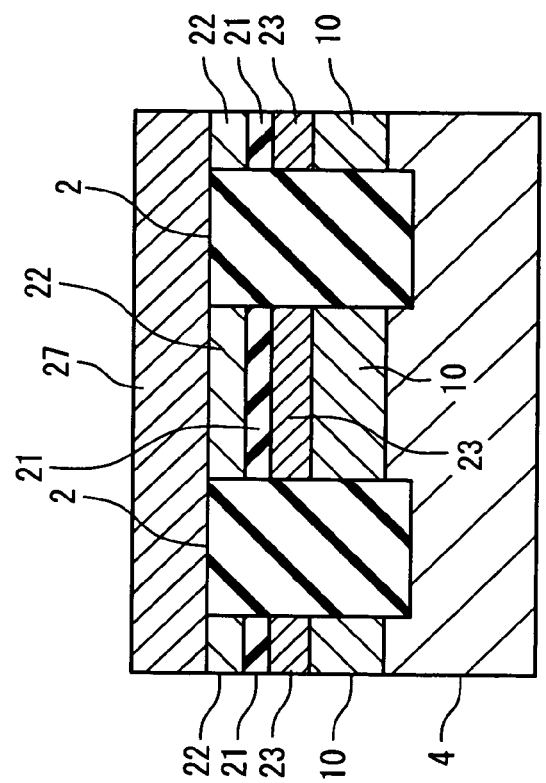
Figures 1, 6F:
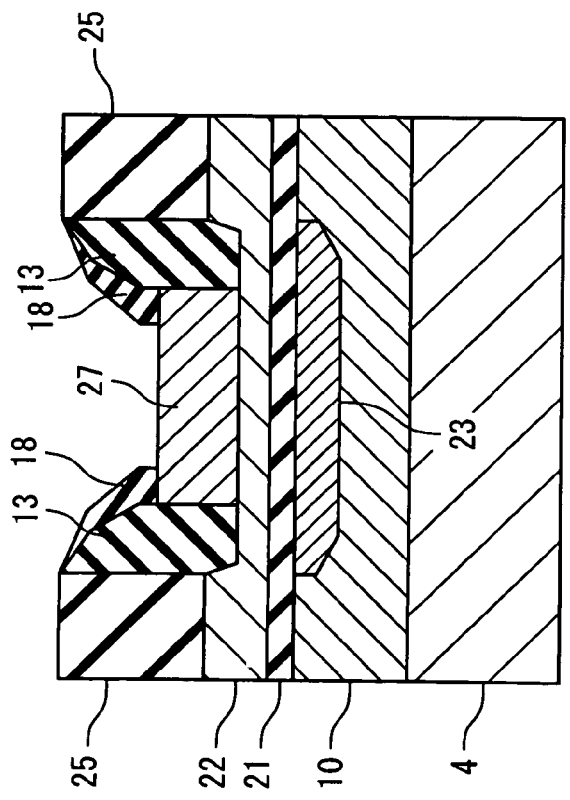

Next, FIGS. 6F-1 and 6F-2 are diagrams showing the semiconductor memory device in a sixth process of a method of manufacturing the split gate type nonvolatile semiconductor memory device 1. FIG. 6F-1 is a sectional view of the split gate type nonvolatile semiconductor memory device along the line A-A in FIG. 6A-3 in the sixth process. FIG. 6F-2 is a sectional view of the split gate type nonvolatile semiconductor memory device along the line B-B in FIG. 6A-3 in the sixth process.

In the sixth process, as shown in FIGS. 6F-1 and 6F-2, an oxide layer having a predetermined thickness is formed by a CVD method. In the present embodiment, the thickness of the oxide film is preferably in a range of approximately 50 to 100 nm. Then, the oxide layer is etched back to form second spacer insulating films 18. The structure of the semiconductor memory device in the word line direction is the same as that in the above-described fifth process.

Figures 4, 6G:
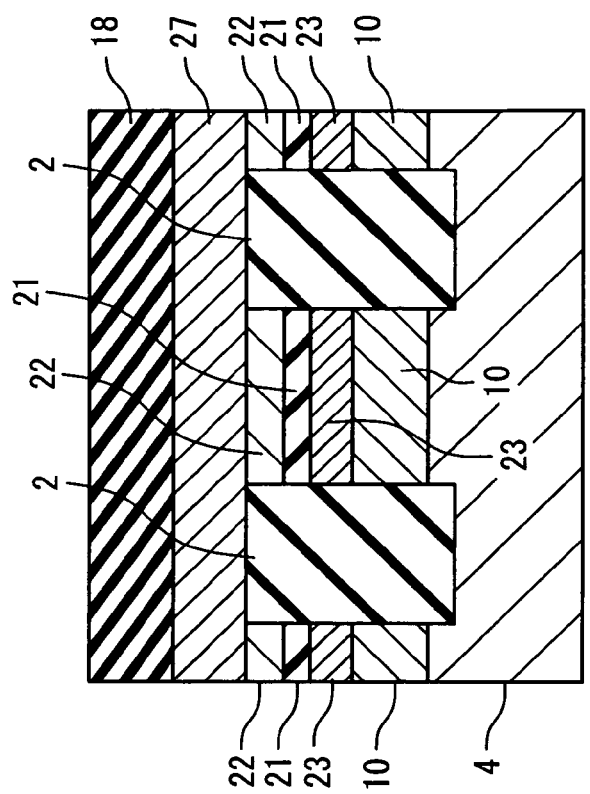
Figures 3, 6G:
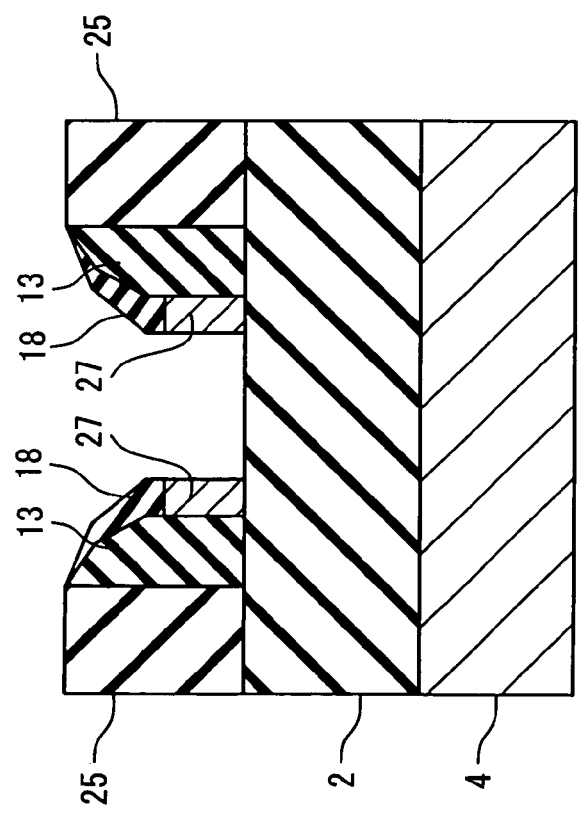
Figures 5, 6G:
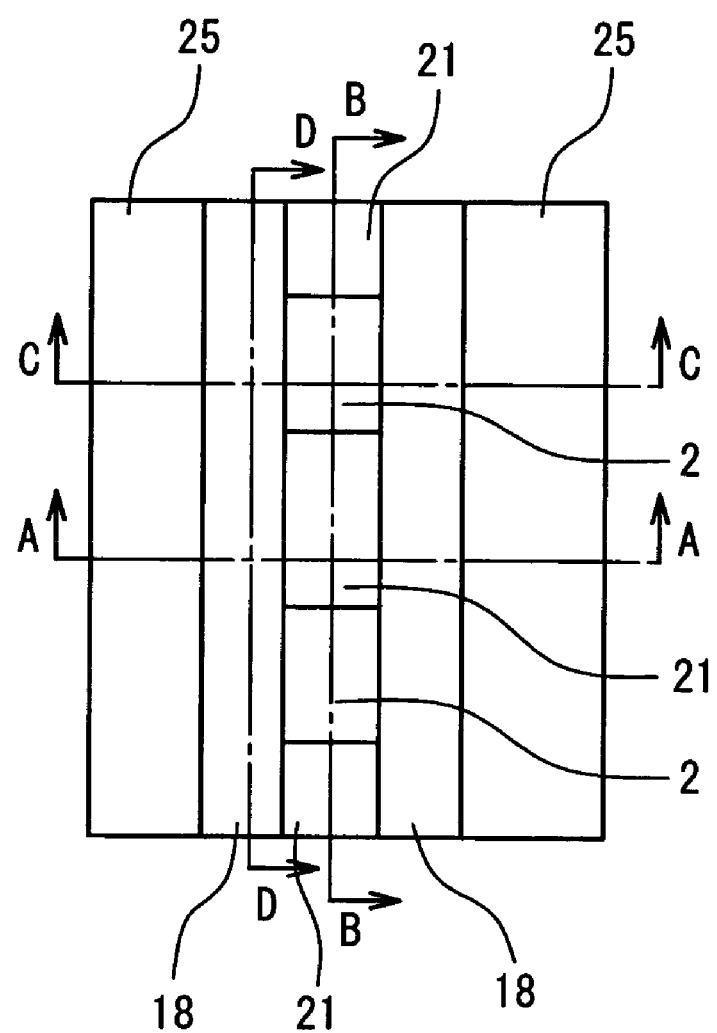

Next, FIGS. 6G-1 to 6G-5 are diagrams showing the semiconductor memory device 1 in a seventh process of a method of manufacturing the split gate type nonvolatile semiconductor memory device 1. FIG. 6G-1 is a sectional view of the split gate type nonvolatile semiconductor memory device along the line A-A in FIG. 6G-5 in the seventh process. FIG. 6G-2 is a sectional view of the split gate type nonvolatile semiconductor memory device along the line B-B in FIG. 6G-5 in the seventh process. FIG. 6G-3 is a sectional view of the split gate type nonvolatile semiconductor memory device along the line C-C in FIG. 6G-5 in the seventh process. FIG. 6G-4 is a sectional view of the split gate type nonvolatile semiconductor memory device along the line D-D in FIG. 6G-5 in the seventh process.

In the seventh process, as shown in FIGS. 6G-1 and 6G-2, the first spacer nitride films 25, the first spacer insulating films 13, and the second spacer insulating films 18 have been formed to extend in the word line direction. The second spacer insulating films 18 are used as a mask to perform anisotropic etching. As a result, an exposed part of the second polysilicon film 27 and the first polysilicon film 22 under the exposed part of the second polysilicon film 27 are removed. The removal of the second polysilicon film 27 and first polysilicon film 22 is also performed to the surface of the element isolating insulating films 2 and the surface of the layer 21 for the gate insulating film. Thus, an opening is formed between the second spacer insulating films 18 opposing to each other. Thus, the surfaces of the element isolating insulating films 2 and the surface of the layer 21 for the gate insulating film are exposed due to the opening.

Also, in the seventh process, as shown in FIGS. 6G-3 and 6G-4, the second polysilicon film 27 formed on the element isolating insulating films 2 is removed while a portion thereof under the second spacer insulating film 18 remaining. Also, the second polysilicon film 27 under the second spacer insulating film 18 is formed in the word line direction without being isolated.

Figure 6H:
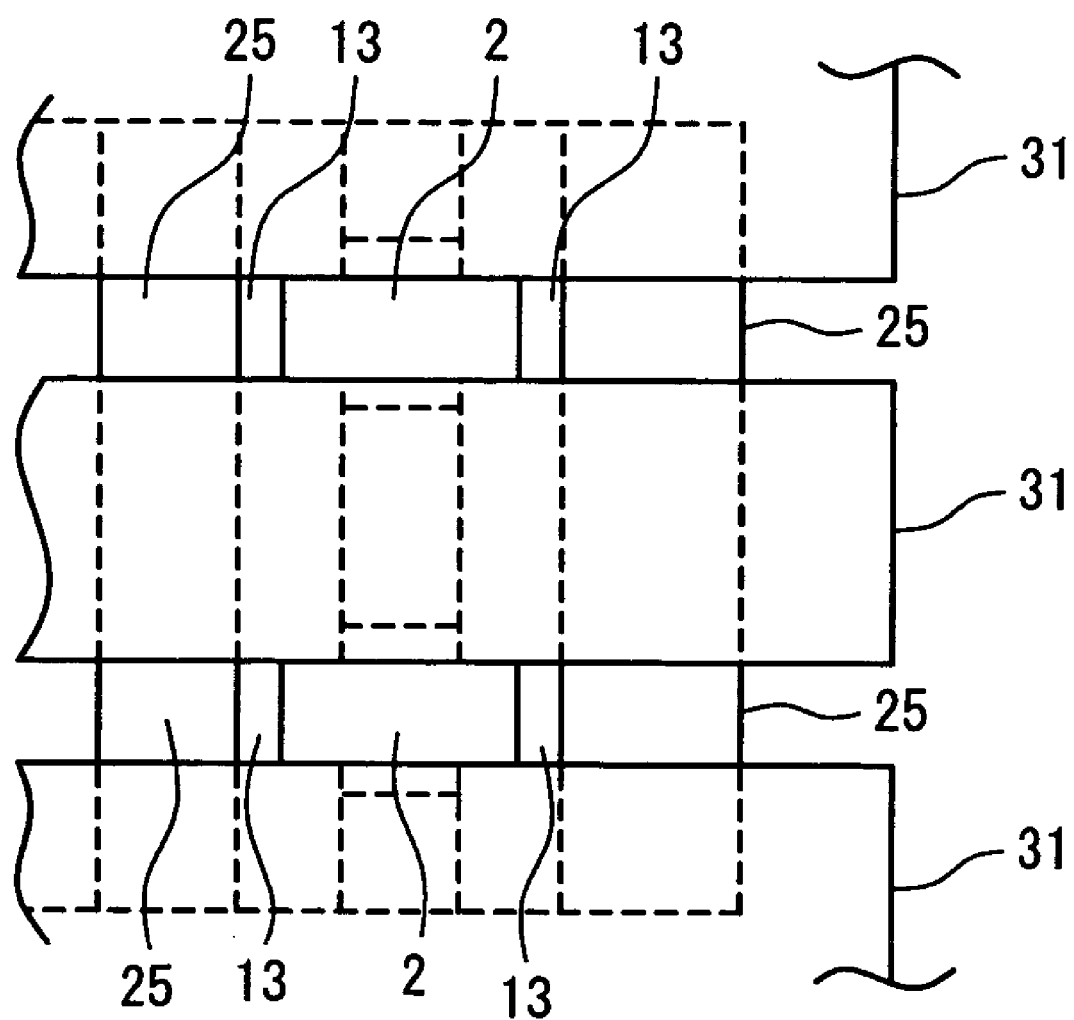
FIG. 6H is a view in an eighth process for manufacturing the split gate type nonvolatile semiconductor memory device of the first embodiment.

FIG. 6H is a plan view showing an eighth process of manufacturing the split gate type nonvolatile semiconductor memory device 1. In the eighth process, a photoresist pattern 31 is formed on the semiconductor structure formed through the above-described first to seventh processes.

Figures 4, 6I:
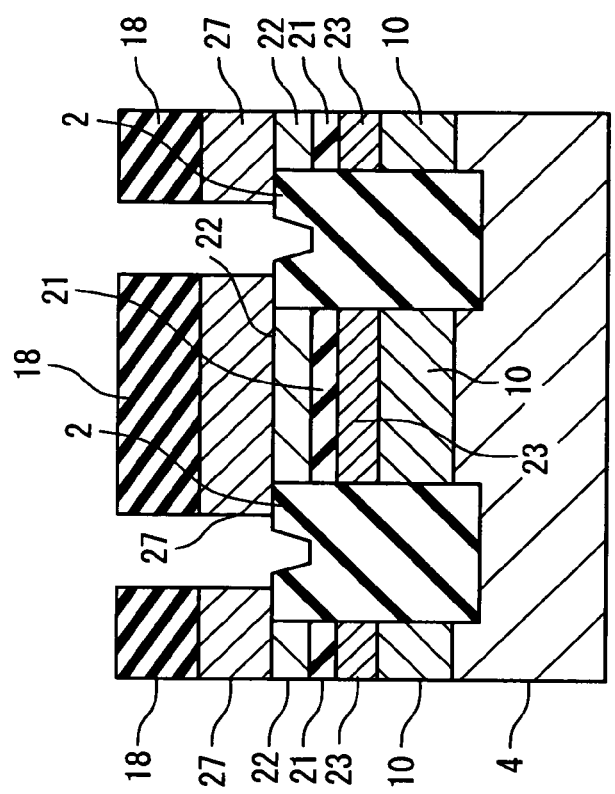
Figures 3, 6I:
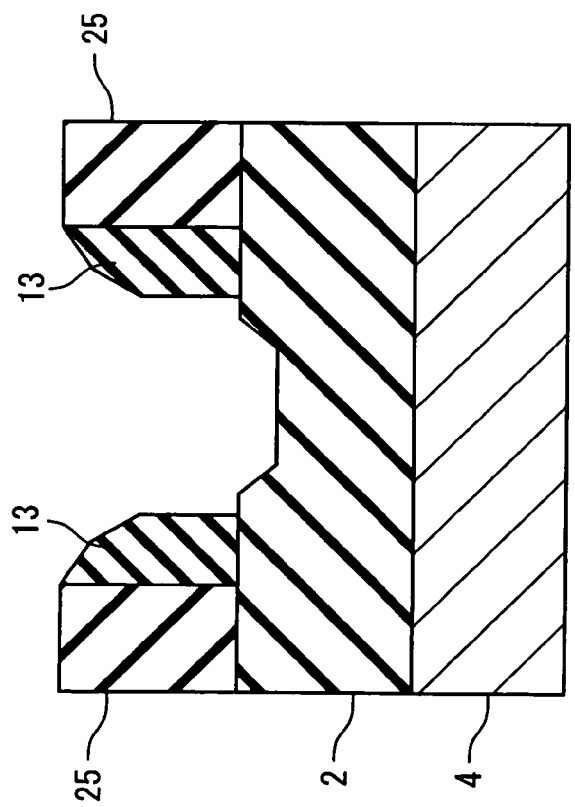
Figures 5, 6I:
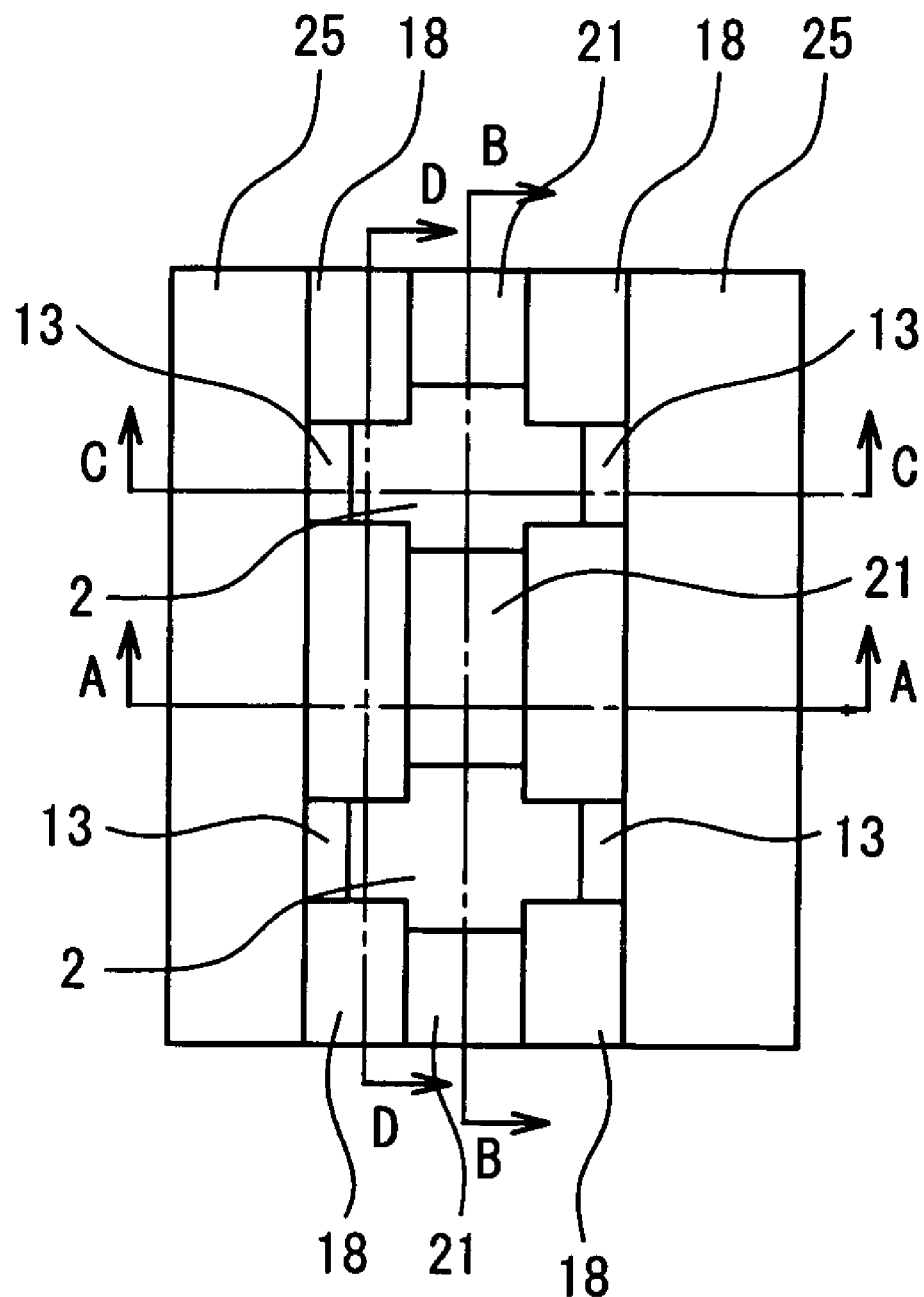

FIGS. 6I-1 to 6I-5 are diagrams showing a ninth process of manufacturing the split gate type nonvolatile semiconductor memory device 1. FIG. 6I-5 is a plan view of the semiconductor structure in the ninth process. FIG. 6I-1 is a cross sectional view of the semiconductor memory device 1 along the line A-A in FIG. 6I-5, and FIG. 6I-2 is a cross sectional view of the semiconductor memory device 1 along the line B-B in FIG. 6I-5. Also, FIG. 6I-3 is a cross sectional view of the semiconductor memory device 1 along the line C-C in FIG. 6I-5, and FIG. 6I-4 is a cross sectional view of the semiconductor memory device 1 along the line D-D in FIG. 6I-5.

The photo-resist pattern 31 is used as a mask to perform isotropic etching. In the ninth process, the layer for the second spacer insulating films 18 exposed on a portion other than the photoresist pattern 31 and the second polysilicon layer 27 under the exposed part of the layer are removed. Through the removal, the second polysilicon layer 27 is isolated in units of elements to form the second floating gate sections 8t for the respective elements. Then, the photo-resist pattern 31 is removed. By removing the photoresist pattern 31, the second spacer insulating films 18 and the gate insulating layer 21 are exposed.

As shown in FIG. 6I-1, a portion along the line A-A has been covered by the photoresist pattern 31 in the eighth process. Accordingly, a structure of that portion is the same as that in the seventh process. Similarly, a cross-section shown in FIG. 6I-2 is also the same as that in the seventh process. In FIG. 6I-3, the second spacer insulating films 18 and the second polysilicon film 27 on the element isolating insulating film 2 have been removed through the etching in the ninth process. Similarly, the surfaces of the element isolating insulating films 2 have also been etched through the above-described etching. In FIG. 6I-4, by partially removing the layer for the second spacer insulating films 18 and the second polysilicon film 27 on the element isolating insulating films 2, the second polysilicon films 27 are isolated in units of elements. Each of the second polysilicon films 27 functions as the second floating gate section 8t in the nonvolatile semiconductor memory cell 1C.

Figures 1, 6J:
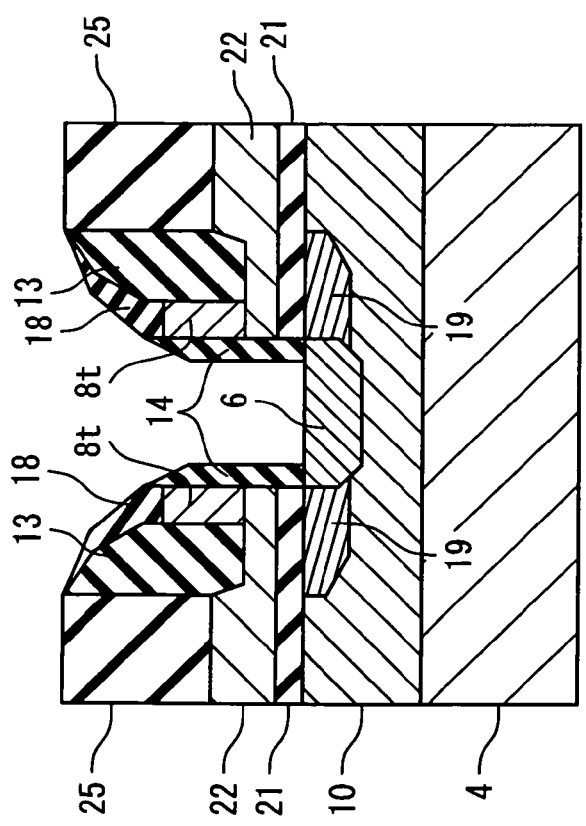
Figures 2, 6J:
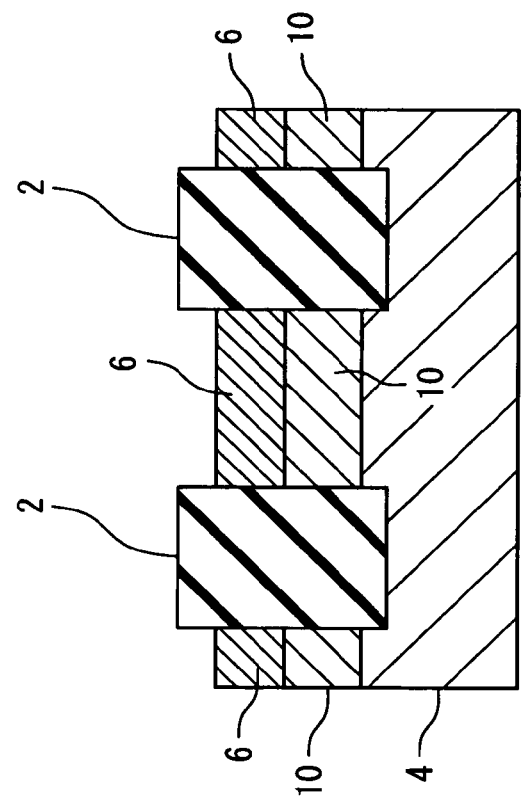

FIGS. 6J-1 and 6J-2 are cross-sectional views showing a tenth process for manufacturing the split gate type nonvolatile semiconductor memory device 1. FIG. 6J-1 shows a cross section in the bit line direction in the tenth process.

In the tenth process, the gate insulating layer 21 is removed by using the second spacer insulating films 18 as mask. Thus, the surface of the well is exposed. Subsequently, the second spacer insulating films 18 are used as the mask so as to implant the impurity into the well 10. Thus, a diffusion layer 6 is formed in the well 10 and the diffusion layer 23 is changed to the diffusion layers 19. Subsequently, an insulating layer is formed and etching back is performed. Thus, third spacer insulating films 14 are formed. FIG. 6J-2 shows a cross section in the word line direction in the tenth process. In the tenth process, the second source/drain diffusion layer 6 is formed near the surface of the semiconductor substrate 4 (near the surface of the well 10).

In the above process, the gate insulating layer 21 is first removed. However, the insulating layer for the films 14 may be first formed and then etched back together with the insulating layer 21, to form the second spacer insulating films 14. The impurity implantation may be performed before the removal of the insulating layer 21.

Figures 1, 6K:
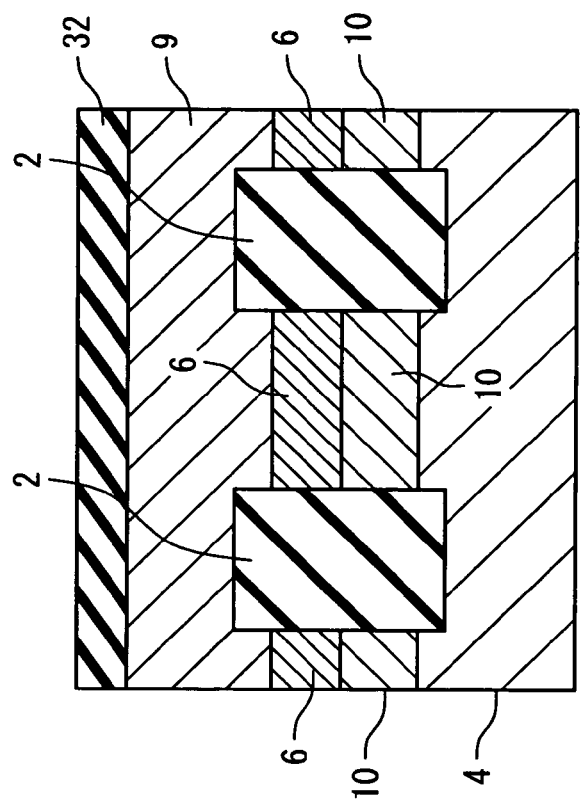
Figures 2, 6K:
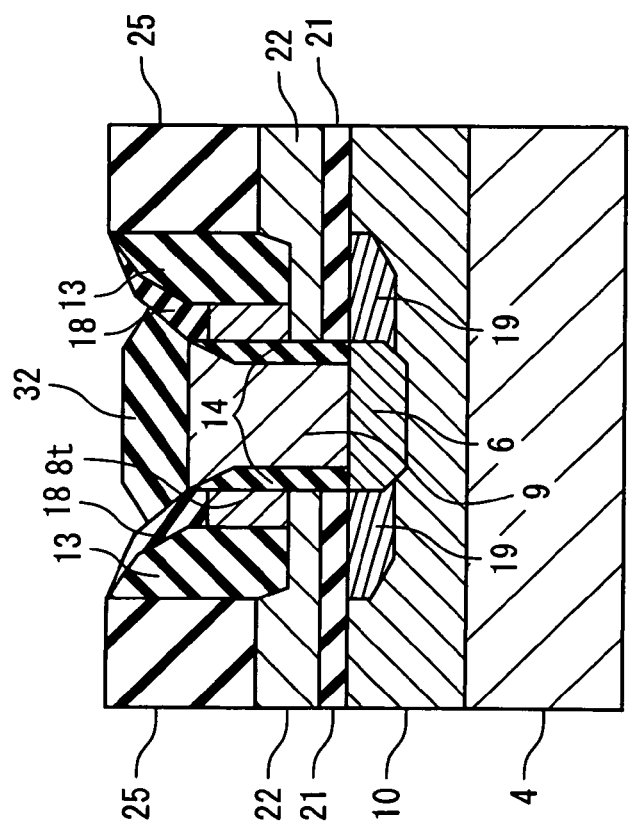

FIGS. 6K-1 and 6K-2 are cross-sectional views showing the memory device 1 in an eleventh process for manufacturing the split gate type nonvolatile semiconductor memory device 1. FIG. 6K-1 shows a cross section in the bit line direction in the eleventh process. FIG. 6K-2 shows a cross section in the word line direction in the eleventh process.

In the eleventh process, the polysilicon plug 9 is formed between the third spacer insulating films 14. Then, a source polysilicon protection oxide layer 32 is formed to cover the polysilicon plug 9. In the eleventh process, the polysilicon plug 9 and the source polysilicon protection oxide layer 32 are formed without being isolated in the word line direction.

Figures 2, 6L:
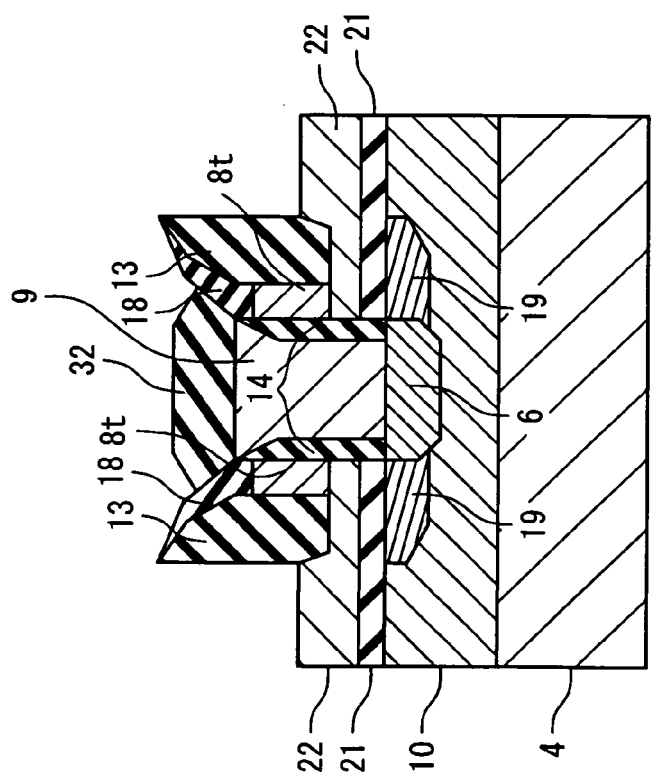
Figures 1, 6L:
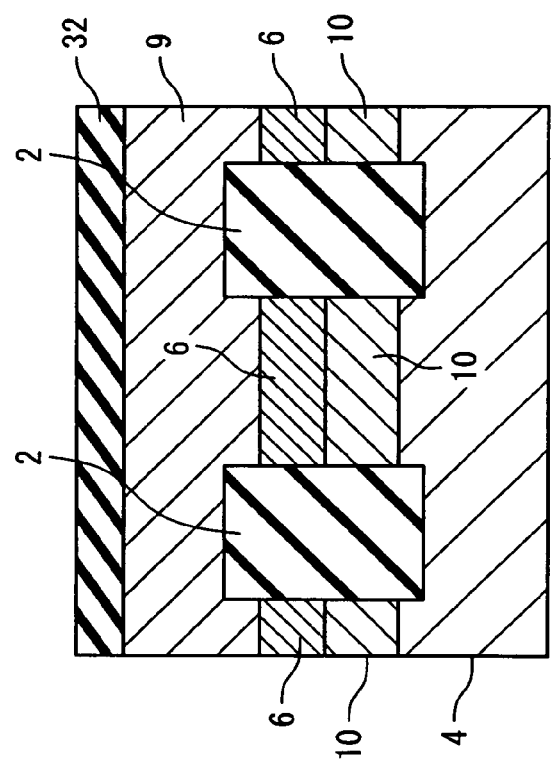

FIGS. 6L-1 and 6L-2 are cross-sectional views showing the memory device 1 in a twelfth process for manufacturing the split gate type nonvolatile semiconductor memory device 1. FIG. 6L-1 shows a cross section in the bit line direction in the twelfth process. In the twelfth process, the first spacer insulating films 13, the second spacer insulating films 18, and the source/polysilicon protective oxide layer 32 are used as a mask to remove the first spacer nitride films 25. The first spacer nitride films 25 are removed by using $H_3PO_4$ heated to 150° C. Through the removal, the surfaces of the first polysilicon films 22 are exposed. As shown in FIG. 6L-2, a structure of a cross section in the word line direction in the twelfth process is the same as that in the above-described eleventh process.

Figures 2, 6M:
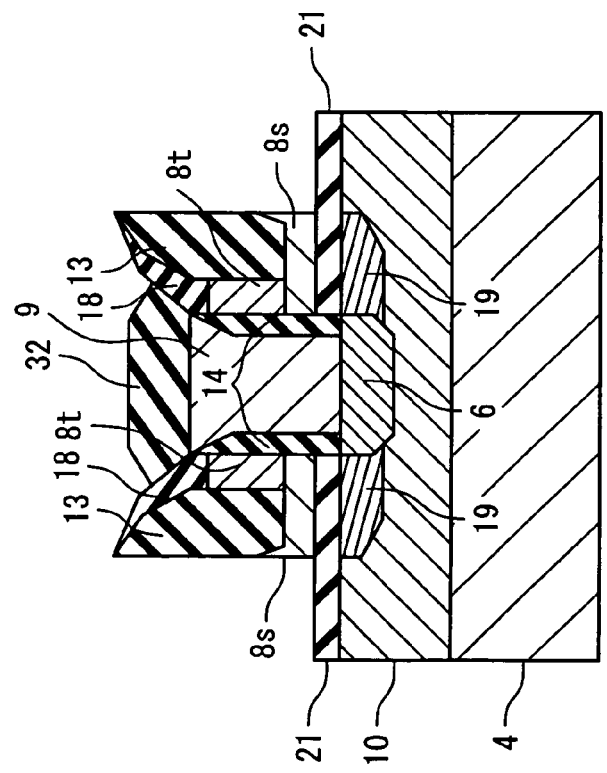
Figures 1, 6M:
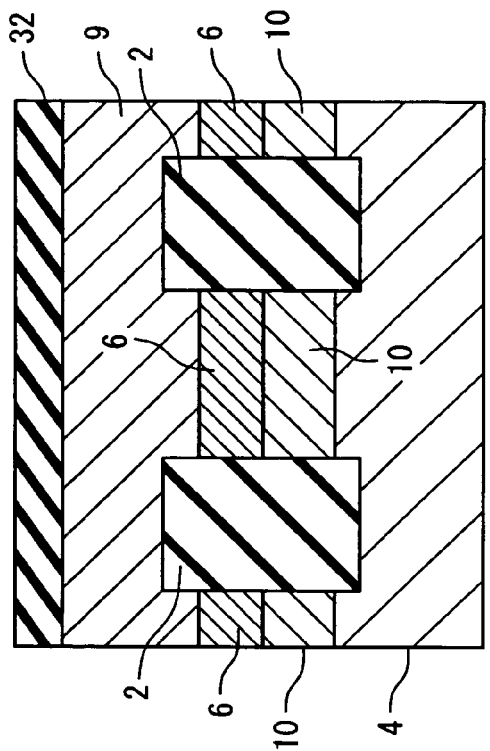

FIGS. 6M-1 and 6M-2 are cross-sectional views showing the memory device 1 in a thirteenth process for manufacturing the split gate type nonvolatile semiconductor memory device 1. FIG. 6M-1 shows a cross section in the bit line direction in the thirteenth process. In the thirteenth process, the first spacer insulating films 13, the second spacer insulating films 18, the source polysilicon protection oxide layer 32 are used as a mask to perform dry etching to the first polysilicon films 22 by a dry etching apparatus. Through the dry etching, the first floating gate section 8s is formed. The etching is preferably anisotropic etching. Also, through the dry etching, the acute angle portions of the first floating gate sections 8s are formed. In addition, a structure of a cross section in the word line direction in the thirteenth process is the same as those in the above eleventh and twelfth processes, as shown in FIG. 6M-2.

Figures 2, 6N:
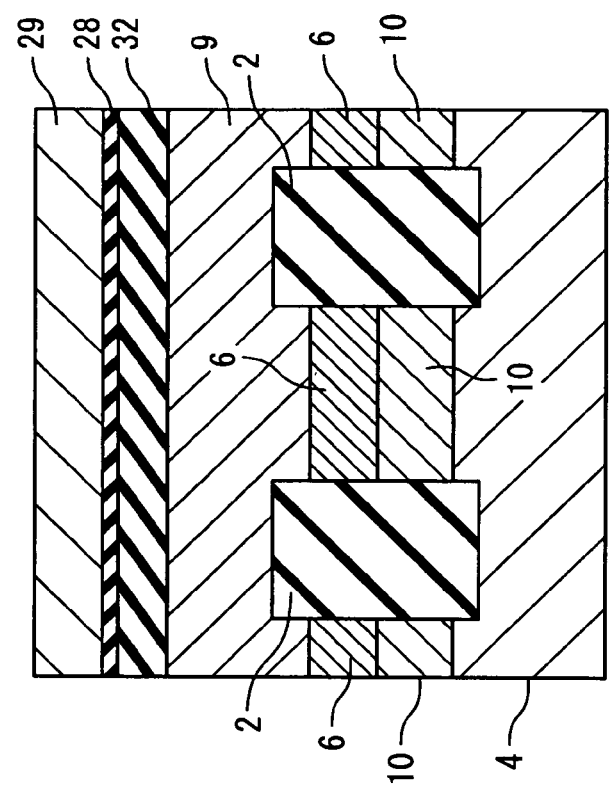
Figures 1, 6N:
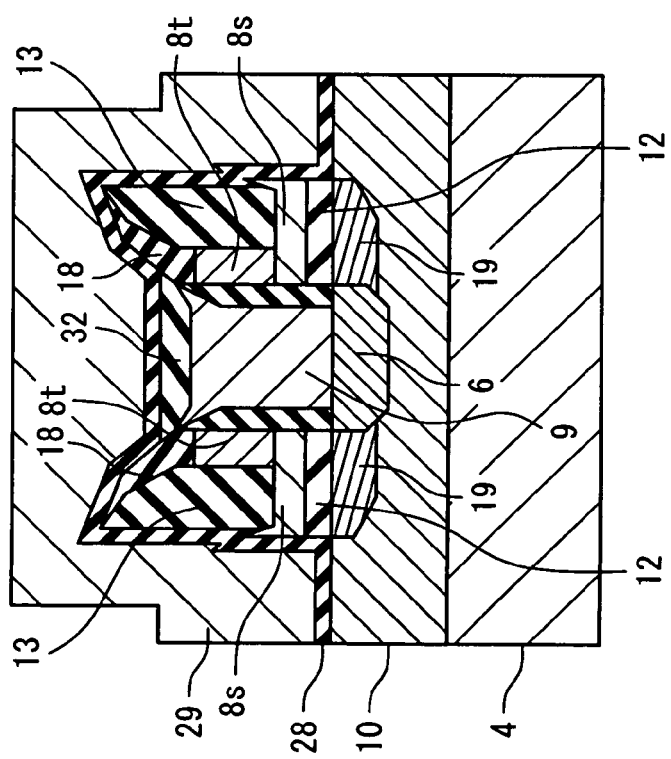
Figure 60:
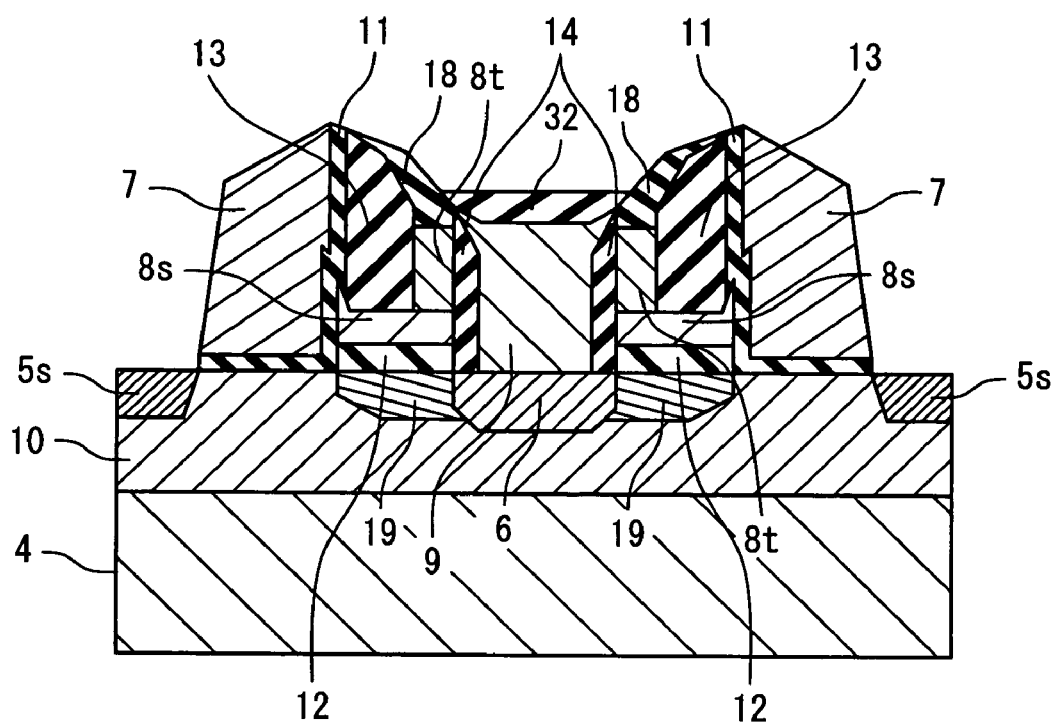

FIGS. 6N-1 and 6N-2 are cross-sectional views showing the memory device 1 in a fourteenth process for manufacturing the split gate type nonvolatile semiconductor memory device 1. FIG. 6N-1 shows the cross section in the bit line direction in the fourteenth process. In the fourteenth process, the first spacer insulating films 13 are used as a mask to remove the exposed portions of the gate insulating layer 21 by wet etching using hydrofluoric acid. Through the removal, the surface of the semiconductor substrate 4 is exposed. Thus, in the fourteenth process, the exposed portions of the gate insulating layer 21 is removed, and the gate insulating film 21 remains under the floating gate 8. The remaining portions of the gate insulating layer 21 function as the gate insulating films 12 in the nonvolatile semiconductor memory cells 1C. Also, at this time, side portions of the first spacer insulating films 13 recedes toward the polysilicon plug 9. Then, a tunnel insulating layer 28 is formed to have the thickness of approximately 16 nm. The tunnel insulating layer 28 covers the exposed portions of the semiconductor substrate 4, the side surfaces of the gate insulating film 12, the side surfaces of the acute angle portions of the floating gate 8 and the first spacer insulating films 13, the upper surfaces of the second spacer insulating films 18, and the upper surface of the source/polysilicon protective oxide layer 32. Subsequently, a polysilicon layer 29 for control gates is formed on the tunnel insulating layer 28. FIG. 6N-2 shows a cross section in the word line direction in the fourteenth process. As shown in FIG. 6N-2, the tunnel insulating layer 28 and the polysilicon layer 29 are formed without being isolated respectively in the word line direction in the fourteenth process.

FIG. 6O is a cross-sectional view showing the memory device 1 in a fifteenth process for manufacturing the split gate type nonvolatile semiconductor memory device 1. FIG. 6O shows a cross section in the bit line direction in the fifteenth process. In the fifteenth process, by etching back the polysilicon layer 29 for the control gates, polysilicon films of a sidewall shape (hereinafter to be referred to as the control gates 7) are formed. Then, exposed portions of the tunnel insulating layer 28 are removed such that the tunnel insulating films 28 remain which are in contact with the control gates 7. Through the removal, the tunnel insulating films 28 function as the tunnel insulating films 11 of the nonvolatile semiconductor memory cells 1C. Subsequently, by using the control gates 7 as a mask, impurity is implanted into the semiconductor substrate 4 to form LDD regions 5s. As shown in FIG. 6O, the control gate 7 is provided to be adjacent to the floating gate 8 through the tunnel insulating film 11. A portion of the control gate 7 may overlap with the acute angle portion of the floating gate 8 on a plan view. Because the edge of the floating gate 8 is formed to have an acute angle, the data erasing operation is appropriately performed. It should be noted that a cross section in the word line direction in the fifteenth process is the same as those shown in FIGS. 6K-2 and 6L-2, and therefore a description thereof is omitted.

Figure 6P:
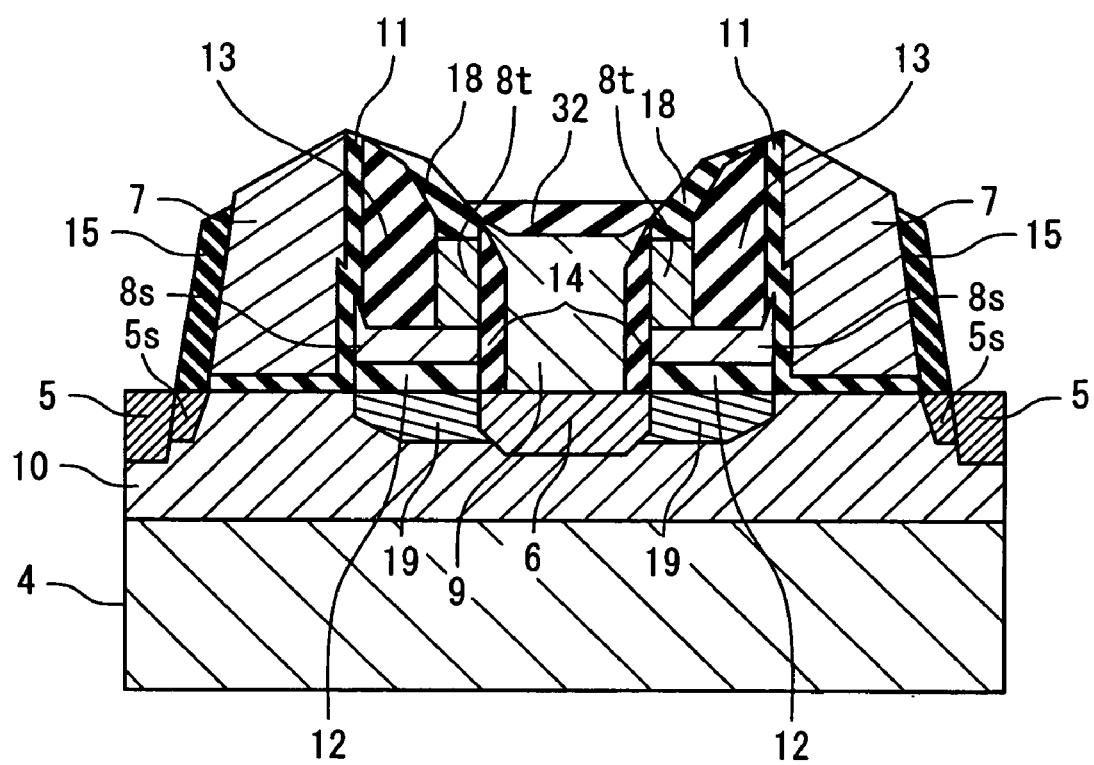
FIG. 6P is a view in a sixteenth process for manufacturing the split gate type nonvolatile semiconductor memory device of the first embodiment.

FIG. 6P is a cross-sectional view showing the memory device 1 in a sixteenth process for manufacturing the split gate type nonvolatile semiconductor memory device 1. FIG. 6P shows a cross section in the bit line direction in the sixteenth process. In the sixteenth process, the LDD sidewalls 15 are formed on the side surfaces of the control gates 7. Then, the LDD sidewalls 15 are used as a mask to form the first source/drain diffusion layers 5 in the well 10 in self-alignment. Subsequently, after silicide films (not shown) are formed on the surfaces of the first source/drain diffusion layers 5, contacts 16 (not shown) are formed to be connected to the first source/drain diffusion layers 5 through the silicide films. Thus, the nonvolatile semiconductor memory cell 1C shown in FIG. 4 is completed. It should be noted that a cross section in the word line direction in the sixteenth process is the same as those illustrated in FIGS. 6K-2 and 6L-2, and therefore a description thereof is omitted.

As described above, the floating gate 8 in the split gate type nonvolatile semiconductor memory device 1 in the first embodiment includes the first floating gate section 8s and the second floating gate section 8t. The second floating gate section 8t is formed to rise along the side surface of the polysilicon plug 9. In the floating gate 8, a total area of a side surface area of the first floating gate section 8s on the polysilicon plug 9 side and a side surface area of the second portion 8t on the polysilicon plug 9 side is larger than the side surface area of the first floating gate section 8s on the control gate 7 side. In other words, an area of an interface between the floating gate 8 and the third spacer insulating film 14 is larger than that of an interface between the floating gate 8 and the tunnel insulating film 11. Through such a structure, the coupling capacitance between the second floating gate section 8t and the polysilicon plug 9 can be increased. Thus, an overlap area between the second source/drain diffusion layer 6 and the floating gate 8 can be reduced, and therefore a cell size and a working voltage can be reduced.

[Second Embodiment]

Figures 2, 7A:
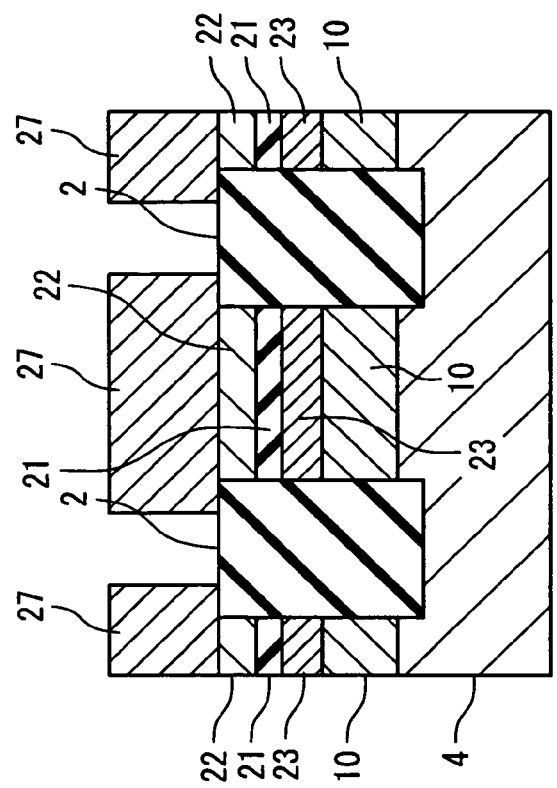
Figures 1, 7A:
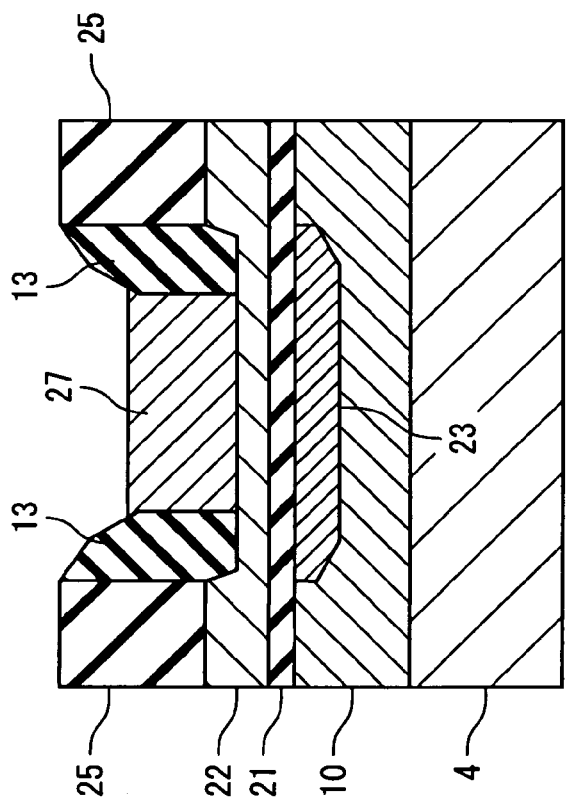
Figures 3, 4, 7A:
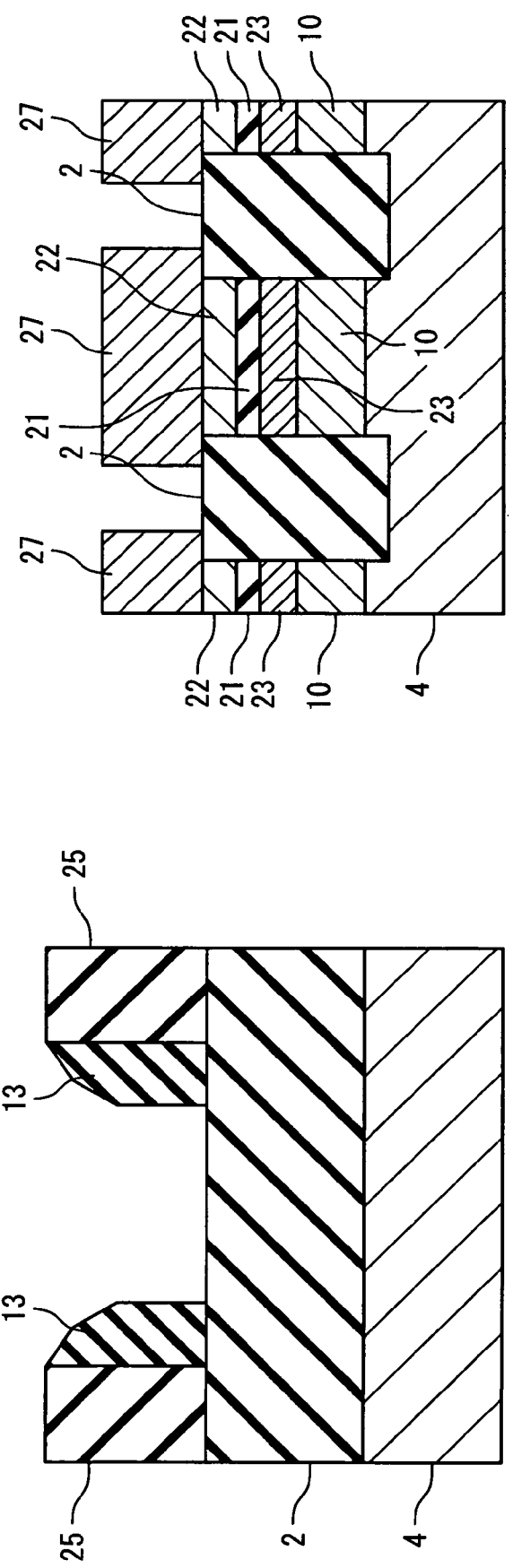
Figures 5, 7A:
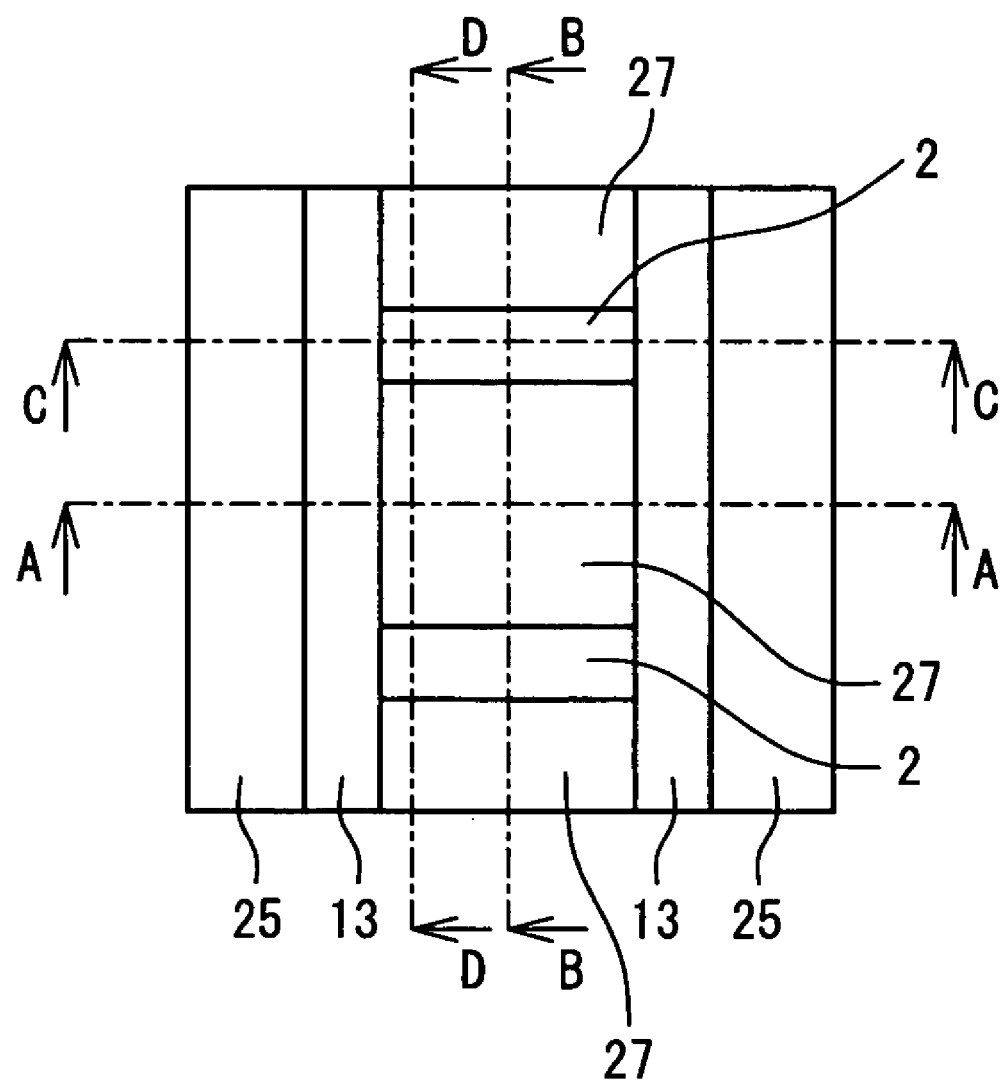

The split gate type nonvolatile semiconductor memory device 1 according to a second embodiment of the present invention will be described below in detail with reference to the drawings. In the second embodiment, the second polysilicon films 27 are isolated in a manner different from that in the first embodiment. FIGS. 7A-1 to 7A-5 are diagrams showing the memory device 1 of the second embodiment in a first process for isolating the second polysilicon films 27.

FIG. 7A-5 is a plan view of the memory device 1 in the first process. FIG. 7A-1 is a cross-sectional view of the semiconductor memory device 1 along the line A-A in FIG. 7A-5, and FIG. 7A-2 is a cross-sectional view of the semiconductor memory device 1 along the line B-B in FIG. 7A-5. Also, FIG. 7A-3 is a cross-sectional view of the semiconductor memory device 1 along the line C-C in FIG. 7A-5, and FIG. 7A-4 is a cross-sectional view of the semiconductor memory device 1 along the line D-D in FIG. 7A-5.

In the first process for isolating a second polysilicon layer 27, a mask similar to the photoresist pattern 31 is formed, and used to perform etching to remove a portion of the second polysilicon layer 27 exposed from the mask. FIG. 7A-1 shows a cross section in the bit line direction. In the first process for isolating the second polysilicon films 27, the second polysilicon layer 27 on the first polysilicon film 22 is not removed. FIG. 7A-2 shows a cross section in the word line direction. As shown in FIGS. 7A-2 and 7A-3, a portion of the second polysilicon layer 27 on the element isolating insulating films 2 is removed. FIG. 7A-4 shows a cross section in the word line direction near the first spacer insulating films 13. In the first process for isolating the second polysilicon films 27, any portion between pairs of the first spacer insulating films 13 facing to each other is formed in substantially the same shape.

Figures 3, 7B:
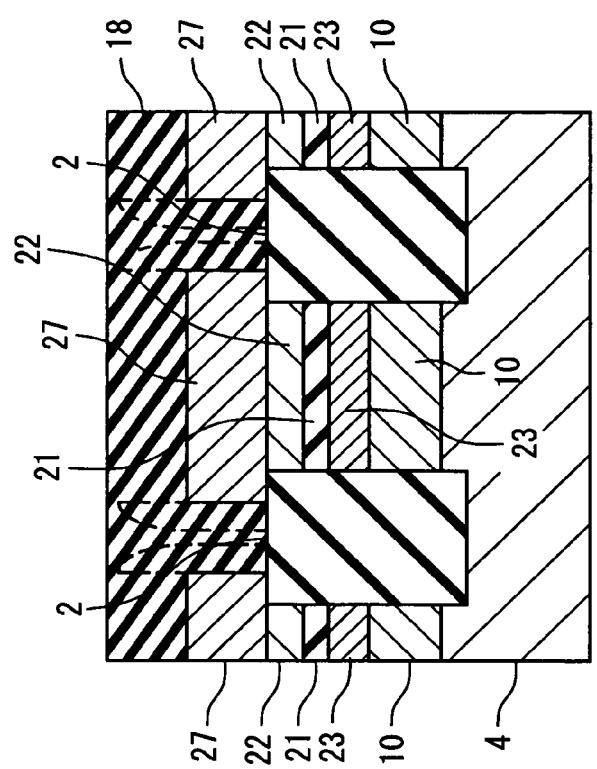
Figures 4, 7B:
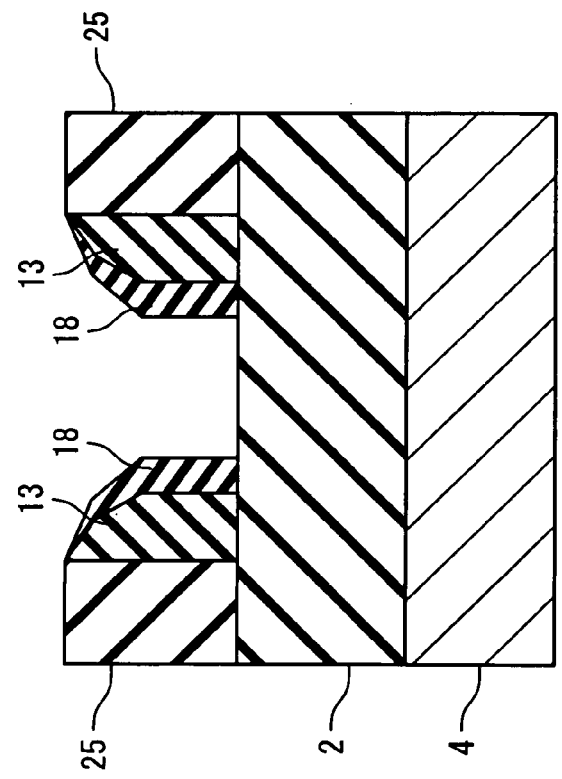
Figures 5, 7B:
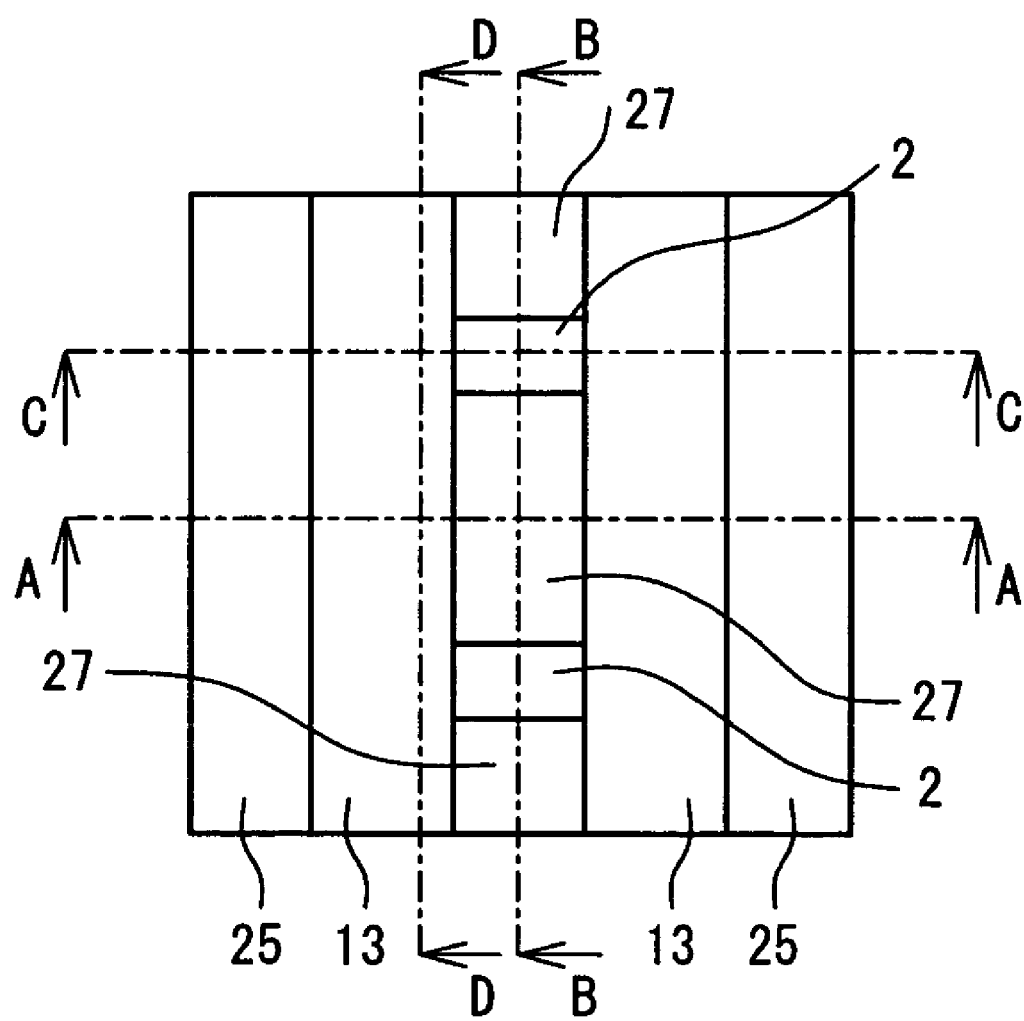

FIGS. 7B-1 to 7B-5 are diagrams showing a second process for isolating the second polysilicon films 27 in the second embodiment. FIG. 7B-5 is a plan view of the semiconductor memory device 1 in the second process for isolating the second polysilicon films 27. FIG. 7B-1 is a cross-sectional view of the semiconductor memory device 1 along the line A-A in FIG. 7B-5, and FIG. 7B-2 is a cross-sectional view of the semiconductor memory device 1 along the line B-B in FIG. 7B-5. Also, FIG. 7B-3 is a cross-sectional view of the semiconductor memory device 1 along the line C-C in FIG. 7B-5, and FIG. 7B-4 is a cross-sectional view of the semiconductor memory device 1 along the line D-D in FIG. 7B-5.

In the second process for isolating the second polysilicon films 27, an oxide layer having a predetermined thickness is formed by a CVD method. Then, the oxide film is etched back to form the second spacer insulating films 18. As shown in FIG. 7B-1, the second spacer insulating films 18 of a sidewall shape are formed on the second polysilicon film 27. The insulating layer is removed between the pair of the first spacer insulating films 13 opposing to each other, and thereby a surface of the second polysilicon film 27 is exposed, as shown in FIG. 7B-2. Also, the surfaces of the element isolating insulating films 2 are exposed around the center between the pair of the first spacer insulating films 13. FIG. 7B-3 shows a cross section in the bit line direction along the element isolating insulating films 2. The second spacer insulating films 18 are formed on side surfaces of the first spacer insulating films 13. Also, the surfaces of the element isolating insulating films 2 between the second spacer insulating films 18 opposing to each other are exposed. FIG. 7B-4 shows a cross section in the word line direction along the second spacer insulating film 18. A layer for the second spacer insulating films 18 is formed in an opening formed between the second polysilicon films 27. Through the formation, the second polysilicon films 27 are isolated in units of elements.

Next, FIG. 7C-1 shows a third process for isolating the second polysilicon films 27. As shown in FIG. 7C-1, in the third process, the second spacer insulating films 18 are used as a mask to remove the second polysilicon films 27 and the first polysilicon film 22 under the second polysilicon film 27 by anisotropic etching. Through the removal, the second floating gate sections 8*t* are formed. FIG. 7C-2 shows the cross section in the word line direction in the third process. The surfaces of the element isolating insulating films 2 and the gate insulating layer 21 are exposed between the second floating gate sections 8*t* opposing to each other Subsequently, the same processes as the tenth process and the subsequent for manufacturing the split gate type nonvolatile semiconductor memory device 1 in the first embodiment are performed. Thus, similarly to the first embodiment, the second floating gate sections 8*t* formed to rise along the side surface of the polysilicon plug 9 to be formed.

[Third Embodiment]

The split gate type nonvolatile semiconductor memory device 1 according to a third embodiment of the present invention will be described below with reference to the drawings. FIG. 8 is a cross-sectional view showing a structure of the split gate type nonvolatile semiconductor memory device 1 in the third embodiment of the present invention. In the first and second embodiments, the present invention is applied to the split gate type nonvolatile semiconductor memory device 1 to be manufactured in a self-alignment. In the third embodiment, the present invention is applied to the split gate type nonvolatile semiconductor memory device 1 to be manufactured without use of the self-alignment. As shown in FIG. 8, the split gate type nonvolatile semiconductor memory device 1 in the third embodiment is provided with the control gate 7 formed to cover the floating gate 8. The control gate 7 and the floating gate 8 are electrically insulated from each other by an interlayer insulating film. The third spacer insulating film 14 is formed between the floating gate 8 and the polysilicon plug 9. The floating gate 8 has a side surface on the polysilicon plug 9 side, and an area thereof is larger than that of a side surface on the control gate 7 side. For this reason, the coupling capacitance between the floating gate 8 and the polysilicon plug 9 is larger. Thus, the overlap area between the second source/drain diffusion layer 6 and the floating gate 8 can be reduced, and therefore a cell size and a working voltage can be reduced.

[Fourth Embodiment]

Figure 9A:
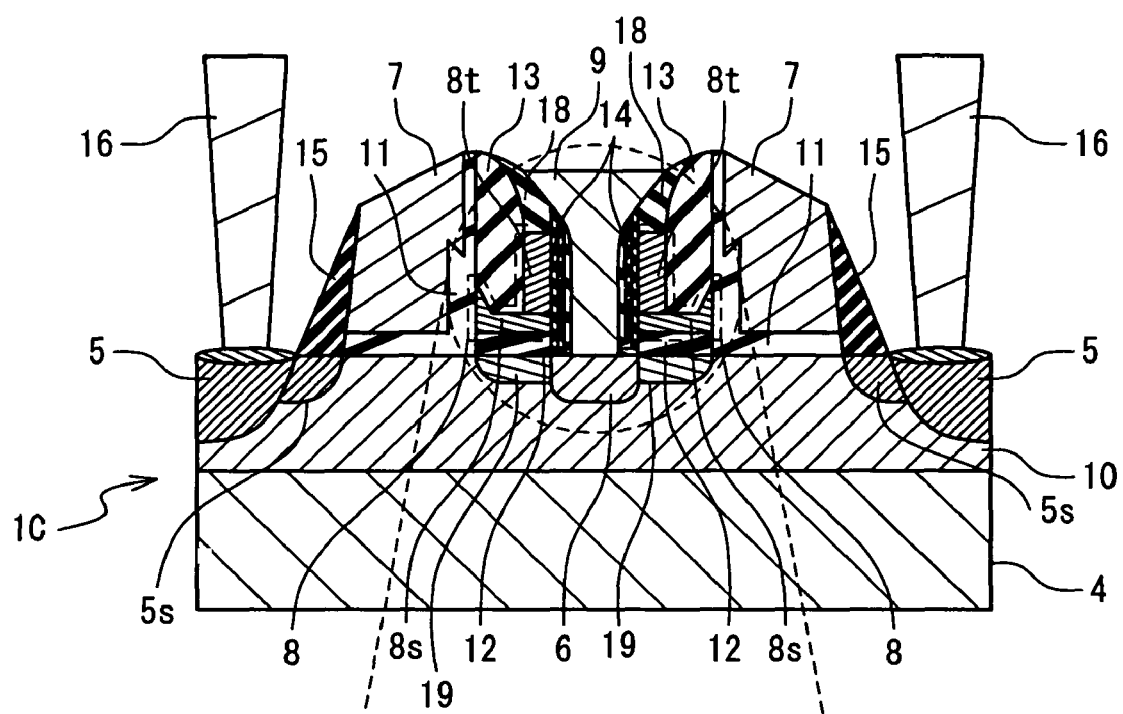
FIGS. 9A and 9B are cross-sectional views of the split gate type nonvolatile semiconductor memory device according to a fourth embodiment of the present invention.
Figure 9B:
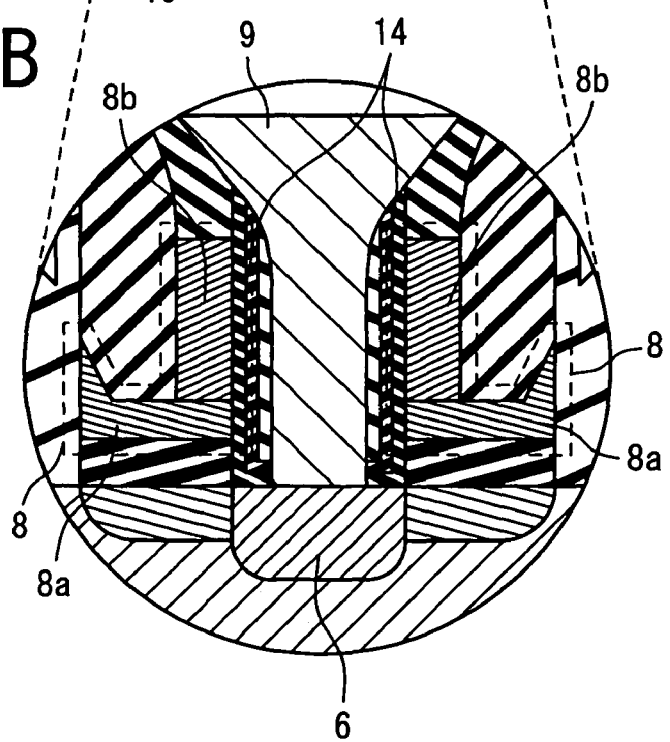

The split gate type nonvolatile semiconductor memory device 1 according to a fourth embodiment of the present invention will be described below with reference to the drawings. The above-described embodiments show a case where each of the third spacer insulating films 14 is a single layer of oxide film. The split gate type nonvolatile semiconductor memory device 1 in the fourth embodiment is provided with a third spacer insulating film 14*c* including a plurality of layers. FIGS. 9A and 9B are cross-sectional view showing the structure of the split gate type nonvolatile semiconductor memory device 1 in the fourth embodiment of the present invention. As shown in FIG. 9A, the third spacer insulating film 14*c* may include an ONO (Oxide Nitride Oxide) film. The third spacer insulating film 14 including the ONO film is preferably formed by sequentially depositing an oxide film, a nitride film, and an oxide film, and then etching back the three-layered insulating film.

To increase the capacitance due to the capacitive coupling between the floating gate 8 and the polysilicon plug 9 in the split gate type nonvolatile semiconductor memory device 1, it is preferable to make the dielectric body thin. However, if the third spacer insulating film 14 includes a single layer of oxide film, reducing a thickness of the film too much may cause deterioration of film quality to thereby make it difficult to suppress charges accumulated in the floating gate 8 from being emitted.

The third spacer insulating film 14 including the ONO (Oxide Nitride Oxide) film has a structure in which the nitride film having a higher dielectric constant is sandwiched. For this reason, if the capacitance is adjusted to the same as that of the third spacer insulating film 14 including the single layer of the oxide film, an electric field applied to the oxide film can be absorbed to thereby effectively hold the charges accumulated in the floating gate 8 while suppressing a reduction in capacitance due to the increased thickness.

Note that the above-described of embodiments may be implemented in combination as far as the configurations and operations in the embodiments are consistent.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A nonvolatile semiconductor memory device, comprising:
    a floating gate formed on a semiconductor substrate through a gate insulating film, said floating gate comprising a split type gate comprising a first portion contacting said gate insulating film and a second portion formed on an upper surface of said first portion and extending upwardly from a part of the upper surface of said first portion;
    a first diffusion layer formed in said semiconductor substrate, and including a plane parallel to a surface of said semiconductor substrate;
    a second diffusion layer formed in said semiconductor substrate and including said plane;
    a control gate provided near said floating gate above a channel region in said semiconductor substrate and formed on a first side of said first portion;
    a conductive film connected with said first diffusion layer and formed on a second side of said first portion and a first side of said second portion through a first insulating film;
    a second insulating film that abuts the upper surface of said first portion; and
    a third insulating film, different from said second insulating film, disposed on an upper surface of said second portion.

2. The nonvolatile semiconductor memory device according to claim 1, wherein said second insulating film is provided between the second side of said second portion and said control gate.

3. The nonvolatile semiconductor memory device according to claim 2, further comprising:
    a tunnel insulating film formed between the first side of said first portion and said control gate,
    wherein said third insulating film is provided between said conductive film and said second insulating film.

4. The nonvolatile semiconductor memory device according to claim 3, wherein said first insulating film comprises a 3-layer layer of a first oxide film, a nitride film and a second oxide film.

5. The nonvolatile semiconductor memory device according to claim 1, wherein said channel region is formed in a straight line between said first diffusion layer and said second diffusion layer.

6. The nonvolatile semiconductor memory device according to claim 1, wherein, in a plan view, said control gate is placed outside said floating gate.

7. The nonvolatile semiconductor memory device according to claim 1, wherein, in a plan view, said first diffusion layer is placed outside the floating gate.

8. The nonvolatile semiconductor memory device according to claim 1, wherein, in a longitudinal direction of an extension of said semiconductor substrate, an area of overlap of said floating gate with said conductive film is larger than an area of overlap of said floating gate with said control gate.

9. The nonvolatile semiconductor memory device according to claim 1, wherein the first portion comprises an acute angle portion that extends on the upper surface of the first portion toward the control gate.

10. The nonvolatile semiconductor memory device according to claim 1,
    wherein said third insulating film abuts said first insulating film and said second insulating film.

11. A nonvolatile semiconductor memory device, comprising:
    a floating gate formed on a surface of a semiconductor substrate through a gate insulating film, said floating gate comprising a split type gate comprising a first portion contacting said gate insulating film and a second portion formed on an upper surface of said first portion;
    a first diffusion layer formed in said semiconductor substrate;
    a second diffusion layer formed in said semiconductor substrate;
    a control gate formed to oppose to a first side of said floating gate;
    a conductive film connected with said first diffusion layer and formed on the surface of said semiconductor substrate to oppose to a second side of said floating gate, the second side being opposite to the first side;
    a first insulating film formed between said second side and said conductive film, wherein an area of the second side is greater than that of the first side;
    a first spacer insulating film that abuts the upper surface of said first portion; and
    a second spacer insulating film, different from said first spacer insulating film, disposed on an upper surface of said second portion.

12. The nonvolatile semiconductor memory device according to claim 11, wherein said second portion of said floating gate comprises a protrusion section provided on the second side to extend upwardly, and
    wherein the first spacer insulating film is formed between said protrusion section and said control gate.

13. The nonvolatile semiconductor memory device according to claim 12, further comprising:
    a tunnel insulating film formed between the first side and said control gate; and
    a second spacer insulating film formed on said protrusion section.

14. The nonvolatile semiconductor memory device according to claim 13, wherein said first insulating film comprises a 3-layer film of a first oxide film, a nitride film and a second oxide film.

15. The nonvolatile semiconductor memory device according to claim 11, wherein a channel region in said semiconductor substrate between said first diffusion layer and said second diffusion layer is formed in a straight line.

16. The nonvolatile semiconductor memory device according to claim 11, wherein, in a plan view, said control gate is placed outside said floating gate.

17. The nonvolatile semiconductor memory device according to claim 11, wherein, in a plan view, said first diffusion layer is placed outside the floating gate.

18. The nonvolatile semiconductor memory device according to claim 11, wherein an upper surface of the first diffusion layer is co-planar with an upper surface of the second diffusion layer.

19. The nonvolatile semiconductor memory device according to claim 11, wherein the first portion comprises an acute angle portion that extends on the upper surface of the first portion toward the control gate.

20. The nonvolatile semiconductor memory device according to claim 11,
wherein said second spacer insulating film abuts said first insulating film and said first spacer insulating film.

* * * * *